(12) United States Patent
Iwayama et al.

(10) Patent No.: US 9,596,754 B2
(45) Date of Patent: Mar. 14, 2017

(54) DRY FILM, PRINTED WIRING BOARD USING SAME, METHOD FOR PRODUCING PRINTED WIRING BOARD, AND FLIP CHIP MOUNTING SUBSTRATE

(71) Applicant: TAIYO INK MFG. CO., LTD., Hiki-gun (JP)

(72) Inventors: Gento Iwayama; Arata Endo, Hiki-gun (JP); Shoji Minegishi, Hiki-gun (JP); Masao Arima, Hiki-gun (JP)

(73) Assignee: TAIYO INK MFG. CO., LTD., Hiki-gun (JP)

( * ) Notice: Subject to any disclaimer, the term of this patent is extended or adjusted under 35 U.S.C. 154(b) by 191 days.

(21) Appl. No.: 14/367,611

(22) PCT Filed: Dec. 18, 2012

(86) PCT No.: PCT/JP2012/082797
§ 371 (c)(1),
(2) Date: Jun. 20, 2014

(87) PCT Pub. No.: WO2013/094606
PCT Pub. Date: Jun. 27, 2013

(65) Prior Publication Data
US 2015/0016072 A1    Jan. 15, 2015

(30) Foreign Application Priority Data

Dec. 22, 2011    (JP) .................................. 2011-282019
Dec. 22, 2011    (JP) .................................. 2011-282020

(51) Int. Cl.
*H05K 1/00*    (2006.01)
*B32B 7/02*    (2006.01)
(Continued)

(52) U.S. Cl.
CPC ........... *H05K 1/0353* (2013.01); *B32B 27/08* (2013.01); *B32B 27/16* (2013.01); *B32B 27/20* (2013.01);
(Continued)

(58) Field of Classification Search
CPC ........ B32B 2307/202; B32B 2307/206; B32B 2457/08; H01L 23/49894; H05K 1/0353;
(Continued)

(56) References Cited

U.S. PATENT DOCUMENTS

2007/0122742 A1* 5/2007 Kato ....................... G03F 7/038
430/270.1
2008/0096133 A1* 4/2008 Kato ..................... C08F 283/10
430/286.1
(Continued)

FOREIGN PATENT DOCUMENTS

CN    102112920 A    6/2011
JP    5-214048 A    8/1993
(Continued)

OTHER PUBLICATIONS

International Search Report issued Apr. 2, 2013 in PCT/JP2012/082797.
(Continued)

*Primary Examiner* — Timothy Thompson
*Assistant Examiner* — Rhadames J Alonzo Miller
(74) *Attorney, Agent, or Firm* — Oblon, McClelland, Maier & Neustadt, L.L.P.

(57) ABSTRACT

A dry film includes a carrier film, a thermosetting resin composition layer, and a photocurable resin composition layer formed between the carrier film and the thermosetting resin composition layer. The thermosetting resin composition layer is formed by applying and drying a thermosetting resin composition. The photocurable resin composition layer
(Continued)

is formed by applying and drying a photocurable resin composition. A method of producing a printed writing board includes forming a resin insulation layer which includes a thermosetting resin composition layer and a photocurable resin composition layer on the substrate, in the order of the thermosetting resin composition layer and the photocurable resin composition layer from a surface side of the substrate, patterning the resin insulation layer by photolithographic approach, and patterning the resin insulation layer by laser processing.

20 Claims, 4 Drawing Sheets

(51) Int. Cl.
| | |
|---|---|
| B32B 27/38 | (2006.01) |
| G06F 7/00 | (2006.01) |
| H01L 21/00 | (2006.01) |
| H05K 1/03 | (2006.01) |
| H01L 21/56 | (2006.01) |
| H05K 3/28 | (2006.01) |
| H01L 23/498 | (2006.01) |
| G03F 7/40 | (2006.01) |
| H05K 3/00 | (2006.01) |
| H05K 3/46 | (2006.01) |
| B32B 27/08 | (2006.01) |
| B32B 27/16 | (2006.01) |
| B32B 27/20 | (2006.01) |
| H05K 3/34 | (2006.01) |

(52) U.S. Cl.
CPC .............. *G03F 7/40* (2013.01); *H01L 21/563* (2013.01); *H01L 23/49816* (2013.01); *H01L 23/49894* (2013.01); *H05K 1/036* (2013.01); *H05K 1/0373* (2013.01); *H05K 3/0082* (2013.01); *H05K 3/281* (2013.01); *H05K 3/4611* (2013.01); *B32B 2264/102* (2013.01); *B32B 2264/104* (2013.01); *B32B 2307/202* (2013.01); *B32B 2307/206* (2013.01); *B32B 2457/08* (2013.01); *H01L 2224/73204* (2013.01); *H01L 2224/92125* (2013.01); *H05K 3/3436* (2013.01); *H05K 2201/0195* (2013.01); *H05K 2201/10674* (2013.01); *H05K 2201/10977* (2013.01); *Y10T 428/24975* (2015.01); *Y10T 428/31515* (2015.04)

(58) Field of Classification Search
CPC ................. H05K 1/036; H05K 1/0373; H05K 2201/0195; H05K 2201/10674; H05K 2201/10977; H05K 3/0082; H05K 3/281; H05K 3/3436; H05K 3/4611
USPC .................. 361/748; 430/319; 428/216, 414; 174/255
See application file for complete search history.

(56) References Cited

U.S. PATENT DOCUMENTS

| | | | |
|---|---|---|---|
| 2009/0194319 A1* | 8/2009 | Itoh ......................... | G03F 7/031 174/250 |
| 2009/0306243 A1* | 12/2009 | Kakutani ................ | G03F 7/027 522/170 |
| 2010/0071828 A1 | 3/2010 | Sato | |
| 2010/0078204 A1 | 4/2010 | We et al. | |
| 2012/0061128 A1* | 3/2012 | Ito ........................... | C08G 8/30 174/255 |

FOREIGN PATENT DOCUMENTS

| | | | |
|---|---|---|---|
| JP | 11-052569 A | | 2/1999 |
| JP | 11-054914 A | | 2/1999 |
| JP | 2001-244384 A | | 9/2001 |
| JP | 2002-003711 A | | 1/2002 |
| JP | 2002003711 A | * | 1/2002 |
| JP | 2004-179576 A | | 6/2004 |
| JP | 2006-284785 A | | 10/2006 |
| JP | 2010-062478 A | | 3/2010 |
| JP | 2010062478 A | * | 3/2010 |
| JP | 2010-76139 A | | 4/2010 |
| JP | 2010-238704 A | | 10/2010 |
| JP | 2010238704 A | * | 10/2010 |
| KR | 10-2010-0036028 A | | 4/2010 |

OTHER PUBLICATIONS

Combined Chinese Office Action and Search Report issued Mar. 3, 2015 in Patent Application No. 201280063442.X (with English Translation of Category of Cited Documents).

Office Action issued May 21, 2015 in Korean Patent Application No. 10-2014-7019959.

Office Action issued Jun. 23, 2015 in Japanese Patent Application No. 2011-282019.

* cited by examiner (A)

(B)

(C)

(D)

(A)

(B)

(C)

(D)

DRY FILM, PRINTED WIRING BOARD USING SAME, METHOD FOR PRODUCING PRINTED WIRING BOARD, AND FLIP CHIP MOUNTING SUBSTRATE

TECHNICAL FIELD

The present invention relates to a dry film and a printed writing board using the same. More particularly, the present invention relates to a dry film capable of forming a cured coating film having an excellent laser processability and a desmear resistance, and a printed writing board using the same. Further, the present invention relates to a method of producing a printed writing board, a printed writing board and a flip-chip mounting substrate which are obtained by the method of producing. More particularly, the present invention relates to a method of producing a printed writing board capable of simply and inexpensively forming a dam preventing from spreading an underfill, a printed writing board obtained by the method of producing, and a flip-chip mounting substrate in which a chip is subjected to flip chip mounting on the printed writing board.

BACKGROUND ART

Generally, in a printed wiring board used in electronic equipments, when an electronic component is mounted on the printed wiring board, not only to prevent a solder from adhering on unnecessary parts, but also to prevent an exposed conductor of a circuit from being corroded by oxidation and humidity, a solder resist layer is formed in a region excluding a connection hole on a substrate on which a circuit pattern is formed.

Presently, a solder resist of the main stream is: one formed by using a photocurable resin composition; and another formed by using a thermosetting resin composition. In case of the photocurable resin composition, a light-irradiated part is cured, and a fine solder resist pattern is formed by removing another uncured part using a dilute alkali solution and an organic solvent.

Meanwhile, as a method for forming a solder resist pattern on a substrate using the thermosetting resin composition, the method for a screen printing of the thermosetting resin composition is employed, but this method is not suitable for forming a fine pattern. Therefore, it is common for forming a solder resist pattern using the thermosetting resin composition and producing a via hole for mounting to be performed by laser-irradiation. In particular, in cases where a fine solder resist pattern is desired, a carbon dioxide gas laser, an UV-YAG laser, an excimer laser or the like is used.

In case of forming a via hole by laser-irradiation, components (smear) of a solder resist film is without being decomposed and removed sufficiently, so that such a phenomenon that the components remain on the bottom of the via hole is generated. In case of remaining such a smear, in a subsequent plate processing, a non-deposition of plating part is generated to produce troubles such as bonding failure and the like when electronic components are mounted. Therefore, the process for removing the smear, so-called desmear process is required (for example, Patent Document 1).

In the desmear process, generally, after swelling with concentrated alkaline solution, a wet method in which a smear is decomposed and removed by permanganate solution is used.

In recent years, associated with decreasing weight and size of electronic equipments, as an interconnecting form of a chip and a printed wiring board, a flip-chip mounting capable of high-density packaging and reduction in the height of semiconductor packages rather than wire bonding is employed.

In the flip-chip mounting, a method for interconnecting between electrodes using a solder ball is widely known. Interconnecting with the use of the solder ball is performed by arranging the solder ball onto one of the electrodes of a wiring board or a chip and reflow after positioning another connecting electrode. Further, an underfill (a sealing resin) is flowed into a gap between the chip and the wiring board and the resultant is cured, thereby enhancing a reliability of connection. In order to reinforce a connection part, the underfill is filled to slightly overflow around from the gap between the chip and the substrate, so that skirts are formed regarding the chip as a top. However, since fluidity is designed to be higher in order to reliably fill the gap between the chip and the substrate, the underfill has a property of easily spreading on the solder resist. In particular, it is necessary that, in the high-density mounting, since the distance between devices around the other and the wiring system is short, the overflowing underfill reaches them, so as not to adversely affect the electrical actuation, to prevent the spread of the underfill.

As one of means of preventing the spread of the underfill, it is known a method of providing a dam in which a step of groovy or projecting part in the solder resist is formed to surround the flip-chip mounting part and then the overflowing underfill is dammed. For example, in Patent Document 2, a method of forming the step by scraping away the solder resist outside the vicinity of the outer edge of the chip using NC milling is heretofore proposed. However, this method is not sufficient to form a high-definition dam. In addition, Patent Document 2 discloses that a method of providing the groove around the chip by removing the uncured part of the photocurable resist. When the amount of underfill reaching the groove is insufficient, however, there is a problem that a conductor pattern located in the groove of dam is exposed unnecessarily. Further, in Patent Document 2, a method of forming a projection part (a projection piece) by applying a resist on a solder resist layer using a silk printing or the like is also heretofore proposed. However, in such method of forming by applying, it is difficult to form a high-definition projection part. Furthermore, Patent Document 2 discloses that the resist of the alkali development type and the UV-curable type can be used for such projection part, but it is no description of specific embodiments and examples including the advantage of the above-described case, the composition of the solder resist layer and the patterning method, and the method of specific realizations is not proposed.

On the other hand, a method of forming a projection part by printing the ink on a solder resist is heretofore proposed (for example, Patent Document 3).

RELATED ART DOCUMENTS

Patent Documents

[Patent Document 1] Japanese Unexamined Patent Application Publication No. H11-54914
[Patent Document 2] Japanese Unexamined Patent Application Publication No. 2001-244384
[Patent Document 3] Japanese Unexamined Patent Application Publication No. 2004-179576

SUMMARY OF THE INVENTION

Problems to be Solved by the Invention

However, when desmear is tried to surely perform in the method as described above, another problem that the surface of the solder resist layer is roughened by such drug solution thereof or the solder resist layer is peeled off is caused. On the other hand, when the phenomenon of roughening and peeling is tried to suppress, there is a problem that the smear cannot be surely removed (desmear may be deteriorated) negatively.

Therefore, it is an object of the present invention to provide a dry film capable of forming a cured coating film having an excellent laser processability and a desmear resistance, and a printed writing board using the same.

In the method of forming the projecting part by printing ink, when the ink is doubly printed to ensure enough height, there is a problem of increasing the number of processes and costs, and taking time. In addition, Patent Document 3 discloses that a method of forming the groovy part by laser processing with a carbon dioxide gas laser is heretofore proposed, but it is unsuitable for forming the wide range of groovy part since the processing time is increased in proportion to the processing area.

Therefore, it is an object of the present invention to provide a method of producing a printed writing board for a flip-chip mounting substrate capable of simply and inexpensively forming a dam preventing from spreading an underfill, a printed writing board obtained by the method of producing, and a flip-chip mounting substrate in which a chip is subjected to flip chip mounting on the printed writing board.

Means for Solving the Problems

The present inventors intensively studied in order to solve the above-described problems and discovered that the above-described problems can be solved by arranging a dry film comprising a photocurable resin composition layer and a thermosetting resin composition layer, thereby completing the present invention.

The present inventors also discovered that the above-described problems can be solved by patterning by photolithographic approach and patterning by laser processing are performed in combination on a resin insulation layer which includes a thermosetting resin composition layer and a photocurable resin composition layer in order from a side of a substrate surface, thereby completing the present invention.

That is, the dry film according to the present invention is a dry film comprising: a carrier film and a photocurable resin composition layer (L1) formed by applying and drying a photocurable resin composition; and at least a thermosetting resin composition layer (L2) formed by applying and drying a thermosetting resin composition in a gap between the photocurable resin composition layer (L1) and the carrier film.

Further, the other dry film according to the present invention is a dry film comprising: a carrier film and a thermosetting resin composition layer (L2); and at least a photocurable resin composition layer (L1) in a gap between the thermosetting resin composition layer (L2) and the carrier film.

In the dry film according to the present invention, it is preferred that the film thickness of the photocurable resin composition layer (L1) is 1 to 20 μm and the film thickness of the thermosetting resin composition layer (L2) is 1 to 100 μm.

In the dry film according to the present invention, it is preferred that a content rate of an inorganic filler in the photocurable resin composition layer (L1) is 0 to 40% by weight based on the total amount of solid contents of the photocurable resin composition forming the layer (L1).

In the dry film according to the present invention, it is preferred that the thermosetting resin composition layer (L2) is formed by applying and drying a thermosetting resin composition which includes (A) an epoxy resin, (B) an epoxy curing agent and (C) an inorganic filler.

In the dry film according to the present invention, it is preferred that the thermosetting resin composition layer (L2) further includes (D) a thermoplastic resin.

In the dry film according to the present invention, it is preferred that a weight-average molecular weight (Mw) of (D) the thermoplastic resin is 5,000 or larger.

In the dry film according to the present invention, it is preferred that the photocurable resin composition layer (L1) is formed by applying and drying a photocurable resin composition which includes (E) a carboxyl group-containing resin, (F) a photopolymerization initiator and (G) a photosensitive monomer.

The printed writing board according to the present invention is a printed writing board comprising a cured coating film which is obtained by using any one of the above-described dry films onto a substrate on which a circuit pattern is formed, wherein the printed writing board includes the cured coating film which is obtained by curing a photocurable resin composition layer (L1) on the side of surface layer, and at least the cured coating film which is obtained by curing the thermosetting resin composition layer (L2) in a gap between the substrate and the cured coating film obtained from the photocurable resin composition layer (L1).

The method of producing the printed writing board according to the present invention is a method of producing a printed writing board comprising: a process in which a resin insulation layer which includes a thermosetting resin composition layer (L2) and a photocurable resin composition layer (L1) in order from a side of a substrate surface is formed on the substrate surface; a process to perform patterning by photolithographic approach; and a process to perform patterning by laser processing.

In the method of producing the printed writing board according to the present invention, it is preferred that a recessed part which is formed in the process to perform patterning by photolithographic approach is a dam.

In the method of producing the printed writing board according to the present invention, it is preferred that the dam is formed with at least one of a groovy shape and a projecting shape.

In the method of producing the printed writing board according to the present invention, it is preferred that the resin insulation layer is formed on the substrate by laminating a dry film which is obtained by laminating the photocurable resin composition layer and the thermosetting resin composition layer on a film.

In the method of producing the printed writing board according to the present invention, it is preferred that the resin insulation layer is formed on the substrate by directly applying and drying a thermosetting resin composition and a photocurable resin composition in this order.

In the method of producing the printed writing board according to the present invention, it is preferred that the photocurable resin composition layer is patterned in the process to perform patterning by photolithographic approach and the thermosetting resin composition layer is patterned in the process to perform patterning by laser processing.

The printed writing board according to the present invention is a printed writing board which is produced by the method of producing a printed writing board.

The flip-chip mounting substrate according to the present invention is a flip-chip mounting substrate, wherein a chip is subjected to flip chip mounting on the printed writing board.

Effects of the Invention

By the present invention, it becomes possible to provide a dry film capable of forming a cured coating film having an excellent laser processability and a desmear resistance, and a printed writing board using the same.

Further, by the present invention, it becomes possible to provide a method of producing a printed writing board capable of simply and inexpensively forming a dam preventing from spreading an underfill, a printed writing board obtained by the method of producing, and a flip-chip mounting substrate in which a chip is subjected to flip chip mounting on the printed writing board.

MODE FOR CARRYING OUT THE INVENTION

<Dry Film>

Figure 1:
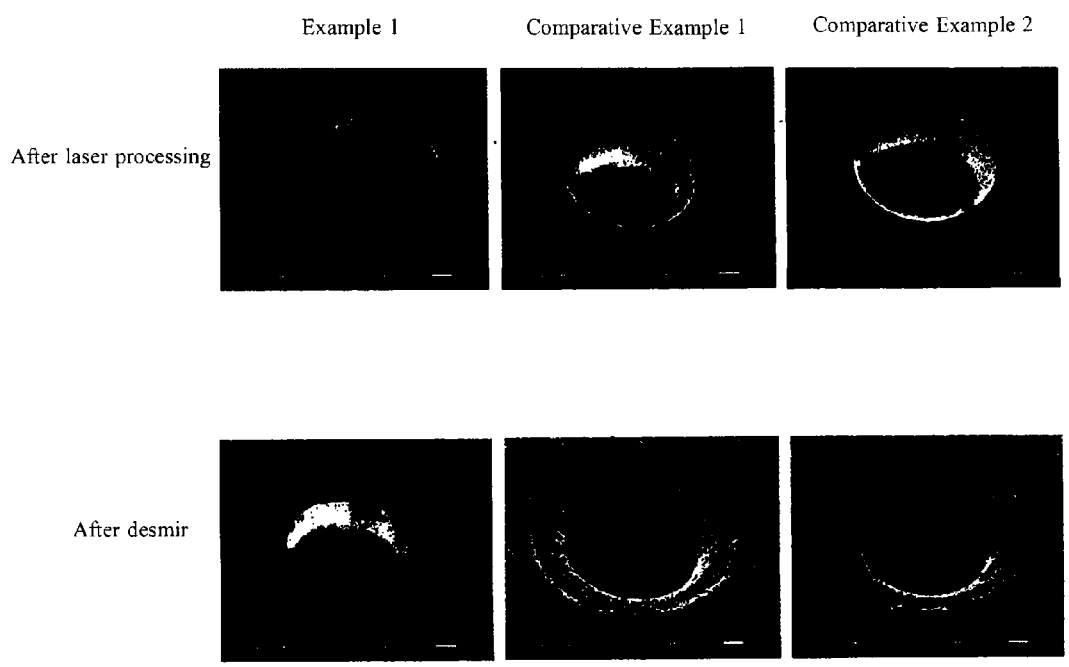
FIG. 1 is a SEM picture around via hole parts after laser processing (before desmear treatment) or desmear treatment about the respective test substrates of Example 1, Comparative Example 1 and Comparative Example 2.

The dry film according to the present invention is a dry film comprising at least: a carrier film; a photocurable resin composition layer (L1) formed by applying and drying a photocurable resin composition; and a thermosetting resin composition layer (L2) formed by applying and drying a thermosetting resin composition. The curable resin composition layer may be formed by lamination the carrier film, the layer (L2) and the layer (L1) in this order, and lamination the carrier film, the layer (L1) and the layer (L2) in this order. In any of embodiments, the dry film is employed by lamination on a substrate such that the layer (L1) is positioned as a surface layer and the layer (L2) is positioned on the side of the substrate. A solder resist having an excellent desmear resistance can be obtained by positioning a cured coating film obtained from the photocurable resin composition layer (L1) on the side of the surface layer. In addition, the solder resist having an excellent electrical property can be obtained by comprising the cured coating film obtained from the thermosetting resin composition layer (L2) in a gap between the layer (L1) and the substrate.

As long as the dry film according to the present invention can be employed by lamination on the substrate such that the layer (L1) is positioned as a surface layer and the layer (L2) is positioned on the side of the substrate as described above, the resin composition layer may comprise two or more layers in the dry film according to the present invention. That is, in case of lamination the carrier film, the layer (L2) and the layer (L1) in this order, the resin composition layer may include another layer except the layer (L2) in a gap between the carrier film and the layer (L1), and in case of lamination the carrier film, the layer (L1) and the layer (L2) in this order, the resin composition layer may further include another resin composition layer in a gap between the layer (L1) and the layer (L2), or on the layer (L2).

A plastic film is used as the carrier film, and a polyester film such as a polyethylene terephthalate, a plastic film such as a polyimide film, a polyamide-imide film, a polypropylene film and a polystyrene film is preferably used. The thickness of the carrier film is not particularly restricted, and it is preferably selected commonly in a range of 10 to 150 μm.

The dry film according to the present invention, in order to prevent dust from adhering to the surface of the curable resin composition layer, it is preferred that a cover film which can be peeled is laminated on the surface of the curable resin composition layer.

The cover film which can be peeled, for example, such as a polyethylene film, a polytetrafluoroethylene film, a polypropylene film and a surface treated paper can be used. When the cover film is peeled, the adhesion of the curable resin composition layer with the cover film may be lower than that of the curable resin composition layer with the carrier film.

The method of producing the dry film according to the present invention is explained as an example of a dry film which is laminated in order of a carrier film, the layer (L1) and the layer (L2). A film is obtained by: diluting a photocurable resin composition for the purpose of forming the layer (L1) with an organic solvent; adjusting the appropriate viscosity thereof; uniformly applying the photosensitive resin composition onto the above-described carrier film using means such as a comma coater, a blade coater, a lip coater, a rod coater, a squeeze coater, a reverse coater, a transfer roll coater, a gravure coater and a spray coater; and drying commonly the resultant at 50 to 130° C. for 1 to 30 minutes. Next, a film is obtained by, in the same manner, diluting and applying a thermosetting resin composition for the purpose of forming the layer (L2), and drying the resultant.

The coating film thickness of the respective layers of L1 and L2 is not particularly restricted, and it is preferred that, after drying, the film thickness of the photocurable resin composition layer (L1) is 1 to 20 μm and the film thickness of the thermosetting resin composition layer (L2) is 1 to 100 μm.

The dry film according to the present invention can be used in the same manner as a known dry film. That is, the resin insulation layer can be formed by lamination the layer (L1) on the substrate with the use of a laminar such that the layer (L1) is positioned as a surface layer.

The above-described substrate may include a printed wiring board or a flexible printed wiring board on which a circuit is preformed, as well as copper-clad laminates of all grades (FR-4 and the like) employing materials such as copper-clad laminates for high frequency circuit in which paper phenol, paper epoxy, glass fabric epoxy, glass polyimide, glass fabric/nonwoven fabric epoxy, glass fabric/paper epoxy, synthetic fiber epoxy, and fluorine/polyethylene/polyphenylene ether/polyphenylene oxide/cyanate ester are used; also polyimide films, PET films, glass substrates, ceramic substrates, wafer plates, and the like.

As described in the above, the curable resin composition layer according to the present invention, which is used for the purpose of forming the cured coating film of the printed writing board according to the present invention, be formed by the curable resin composition layer constituting the dry film according to the present invention.

Here, the curable resin composition layer may also be formed by directly applying the curable resin composition onto a substrate using an appropriate means, such as a blade coater, a lip coater, a comma coater or a film coater, and then drying the resultant.

Alternatively, a thermosetting resin composition layer may also be formed by directly applying and drying a thermosetting resin composition onto a substrate and then the photocurable resin composition layer may also be formed by laminating a dry film on the thus formed thermosetting resin composition layer.

Conversely, the thermosetting resin composition layer may also be formed by laminating the dry film on the substrate and then the photocurable resin composition layer may also be formed by directly applying and drying the photocurable resin composition on the thus formed thermosetting resin composition layer.

The above-described the layer (L1) is the photocurable resin composition layer formed by applying and drying the photocurable resin composition. The layer is photo-cured after laminating the dry film according to the present invention on the substrate. After curing, forming pattern can be perform by laser processing.

In the above-described the layer (L1), it is preferred that the content rate of the inorganic filler as described below is 0 to 40% by weight, more preferably 0 to 30% by weight, based on the total amount of solid contents of the thermosetting resin composition forming the layer (L1). An excellent desmear resistance is exhibited by containing the inorganic filler in this range.

It is preferred that the photocurable resin composition constituting the above-described the layer (L1) includes (E) a carboxyl group-containing resin, (F) a photopolymerization initiator and (G) a photosensitive monomer.

[(E) Carboxyl Group-Containing Resin]

As a carboxyl group-containing resin, a variety of conventionally known carboxyl group-containing resins having a carboxyl group in the molecule may be employed. In particular, from the standpoints of photocurability and resolution, a carboxyl group-containing photosensitive resin having an ethylenically unsaturated double bond in the molecule is preferred. It is preferred that the ethylenically unsaturated double bond be originated from acrylic acid, methacrylic acid or a derivative thereof.

Specific examples of the carboxyl group-containing resin include the following compounds (that may each be either an oligomer or a polymer).

(1) A carboxyl group-containing non-photosensitive resin obtained by copolymerization of an unsaturated carboxylic acid such as (meth)acrylic acid and an unsaturated group-containing compound such as styrene, α-methylstyrene, a lower alkyl (meth)acrylate or isobutylene.

(2) A carboxyl group-containing non-photosensitive urethane resin obtained by a polyaddition reaction of a diisocyanate (e.g. an aliphatic diisocyanate, a branched aliphatic diisocyanate, an alicyclic diisocyanate or an aromatic diisocyanate), a carboxyl group-containing dialcohol compound (e.g. dimethylol propionic acid or dimethylol butanoic acid) and a diol compound (e.g. a polycarbonate-based polyol, a polyether-based polyol, a polyester-based polyol, a polyolefin-based polyol, an acrylic polyol, a bisphenol A-type alkylene oxide adduct diol or a compound having a phenolic hydroxyl group and an alcoholic hydroxyl group).

(3) A carboxyl group-containing photosensitive urethane resin obtained by a polyaddition reaction of a diisocyanate; a (meth)acrylate or partial acid anhydride-modified product of a bifunctional epoxy resin such as a bisphenol A-type epoxy resin, a hydrogenated bisphenol A-type epoxy resin, a bisphenol F-type epoxy resin, a bisphenol S-type epoxy resin, a bixylenol-type epoxy resin or a biphenol-type epoxy resin; a carboxyl group-containing dialcohol compound; and a diol compound.

(4) A carboxyl group-containing photosensitive urethane resin having a (meth)acrylated terminal, which is obtained by adding a compound having one hydroxyl group and at least one (meth)acryloyl group in the molecule, such as hydroxyalkyl (meth)acrylate, during the synthesis of the resin described in the above (2) or (3).

(5) A carboxyl group-containing photosensitive urethane resin having a (meth)acrylated terminal, which is obtained by adding a compound having one isocyanate group and at least one (meth)acryloyl group in the molecule, such as an equimolar reaction product of isophorone diisocyanate and pentaerythritol triacrylate, during the synthesis of the resin described in the above (2) or (3).

(6) A carboxyl group-containing photosensitive resin prepared by allowing the later-described polyfunctional (solid) epoxy resin, which has two or more functional groups, to react with (meth)acrylic acid and then adding a dibasic acid anhydride to a hydroxyl group existing in the side chain of the resultant.

(7) A carboxyl group-containing photosensitive resin prepared by allowing a polyfunctional epoxy resin, which is obtained by further epoxidizing a hydroxyl group of the later-described bifunctional (solid) epoxy resin with epichlorohydrin, to react with (meth)acrylic acid and then adding a dibasic acid anhydride to the resulting hydroxyl group.

(8) A carboxyl group-containing non-photosensitive polyester resin prepared by allowing the later-described bifunctional oxetane resin to react with a dicarboxylic acid such as adipic acid, phthalic acid or hexahydrophthalic acid and then adding a dibasic acid anhydride, such as phthalic anhydride, tetrahydrophthalic anhydride or hexahydrophthalic anhydride, to the resulting primary hydroxyl group.

(9) A carboxyl group-containing photosensitive resin prepared by allowing a reaction product, which is obtained by a reaction between a compound having a plurality of phenolic hydroxyl groups in one molecule and an alkylene oxide such as ethylene oxide or propylene oxide, to react with an unsaturated group-containing monocarboxylic acid and then further allowing the thus obtained reaction product to react with a polybasic acid anhydride.

(10) A carboxyl group-containing photosensitive resin prepared by allowing a reaction product, which is obtained by a reaction between a compound having a plurality of phenolic hydroxyl groups in one molecule and a cyclic carbonate compound such as ethylene carbonate or propylene carbonate, to react with an unsaturated group-containing monocarboxylic acid and then further allowing the thus obtained reaction product to react with a polybasic acid anhydride.

(11) A carboxyl group-containing photosensitive resin obtained by further adding a compound having one epoxy group and at least one (meth)acryloyl group in one molecule to any one of the resins described in the above (1) to (10).

Here, the term "(meth)acrylate" used herein is a general term for acrylates, methacrylates and mixtures thereof and this is hereinafter applicable to all similar expressions.

Since such carboxyl group-containing resins described in the above have a number of carboxyl groups in the side chain of the backbone polymer, they can be developed with a dilute aqueous alkaline solution.

Further, the above-described carboxyl group-containing resin has an acid value in the range of appropriately 40 to 200 mg KOH/g, more preferably 45 to 120 mg KOH/g. When the acid value of the carboxyl group-containing resin is less than 40 mg KOH/g, development with an alkali may become difficult. Meanwhile, when the acid value is higher than 200 mg KOH/g, since the developing solution further dissolves the exposed part, the resulting lines may become excessively thin and in some cases, the exposed and non-exposed parts may be indistinctively dissolved and detached by the developing solution, making it difficult to draw a normal resist pattern; therefore, such an acid value is not preferred.

Further, the weight-average molecular weight of the above-described carboxyl group-containing resin varies depending on the resin skeleton; however, in general, it is preferably in the range of 2,000 to 150,000, more preferably in the range of 5,000 to 100,000. When the weight-average molecular weight is less than 2,000, the tack-free performance may be impaired and the moisture resistance of the resulting coating film after exposure may be deteriorated to cause a reduction in the film during development, which may greatly deteriorate the resolution. Meanwhile, when the weight-average molecular weight exceeds 150,000, the developing property may be markedly deteriorated and the storage stability may be impaired.

The content of such carboxyl group-containing resin is in the range of appropriately 20 to 60% by mass, preferably 30 to 50% by mass, in the photocurable resin composition. When the content of the carboxyl group-containing resin is less than the above-described range, for example, the strength of the resulting coating film may be reduced, which is not preferred. Meanwhile, when the content is higher than the above-described range, the viscosity of the photocurable resin composition may be increased and the coating properties on the carrier film and the like may be deteriorated, which are not preferred.

The carboxyl group-containing resin is not restricted to those enumerated in the above, and these carboxyl group-containing resins described in the above may be used individually, or two or more thereof may be used in combination. In particular, among the above-described carboxyl group-containing resins, those having an aromatic ring are preferred since they have a high refractive index and excellent resolution, and those having a novolac structure are more preferred since they not only have a high resolution but also are excellent in the PCT and the cracking resistance. In particular, the carboxyl group-containing resin which is synthesized by using a phenol compound such as the carboxyl group-containing resin (9) and (10) as a starting material has excellent HAST resistance and PCT resistance, so that it can be preferably used.

[(F) Photopolymerization Initiator]

As the photopolymerization initiator, at least one photopolymerization initiator selected from the group consisting of oxime ester-based photopolymerization initiators having an oxime ester group, α-aminoacetophenone-based photopolymerization initiators, and acylphosphine oxide-based photopolymerization initiators can be suitably used.

Particularly, the above-described oxime ester-based photopolymerization initiators are preferred since they can inhibit generation of outgas only in a small amount and exhibits an effect of imparting the PCT resistance and the cracking resistance. In addition to oxime ester-based photopolymerization initiators, acylphosphine oxide-based photopolymerization initiators are preferably used in combination since the shape having an excellent resolution can be obtained.

Examples of commercially available oxime ester-based photopolymerization initiator include CGI-325, IRGACURE OXE01 and IRGACURE OXE02, which are manufactured by BASF Japan Ltd.; and N-1919 and NCI-831, which are manufactured by ADEKA CORPORATION. Further, a photopolymerization initiator having two oxime ester groups in the molecule can also be suitably used, and specific examples thereof include those oxime ester compounds having a carbazole structure which are represented by the following formula:

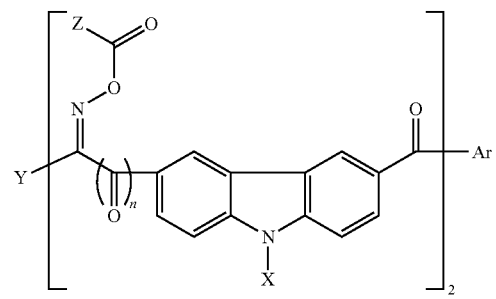

(wherein, X represents a hydrogen atom, an alkyl group having 1 to 17 carbon atoms, an alkoxy group having 1 to 8 carbon atoms, a phenyl group, a phenyl group (which is substituted with an alkyl group having 1 to 17 carbon atoms, an alkoxy group having 1 to 8 carbon atoms, an amino group, or an alkylamino or dialkylamino group containing an alkyl group having 1 to 8 carbon atoms), a naphthyl group (which is substituted with an alkyl group having 1 to 17 carbon atoms, an alkoxy group having 1 to 8 carbon atoms, an amino group, or an alkylamino or dialkylamino group containing an alkyl group having 1 to 8 carbon atoms); Y and Z each independently represent a hydrogen atom, an alkyl group having 1 to 17 carbon atoms, an alkoxy group having 1 to 8 carbon atoms, a halogen group, a phenyl group, a phenyl group (which is substituted with an alkyl group having 1 to 17 carbon atoms, an alkoxy group having 1 to 8 carbon atoms, an amino group, or an alkylamino or dialkylamino group containing an alkyl group having 1 to 8 carbon atoms), a naphthyl group (which is substituted with an alkyl group having 1 to 17 carbon atoms, an alkoxy group having 1 to 8 carbon atoms, an amino group, or an alkylamino or dialkylamino group containing an alkyl group having 1 to 8 carbon atoms), an anthryl group, a pyridyl group, a benzofuryl group or a benzothienyl group; Ar represents a bond, an alkylene having 1 to 10 carbon atoms, a vinylene, a phenylene, a biphenylene, a pyridylene, a naphthylene, a thiophene, an anthrylene, a thienylene, a furylene, 2,5-pyrrole-diyl, 4,4'-stilbene-diyl or 4,2'-styrene-diyl; and n is an integer of 0 or 1).

Particularly, in the above-described formula, it is preferred that X and Y be each a methyl group or an ethyl group; Z be methyl or phenyl; n be 0; and Ar be a bond, a phenylene, a naphthylene, a thiophene or a thienylene.

Further, examples of preferred carbazole oxime ester compound include those compounds that are represented by the following formula:

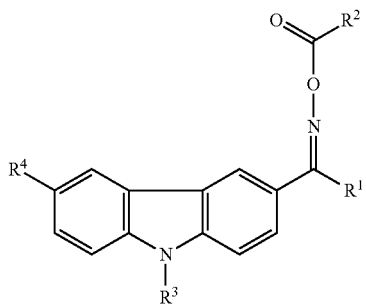

(wherein, $R^1$ represents an alkyl group having 1 to 4 carbon atoms or a phenyl group which is optionally substituted with a nitro group, a halogen atom or an alkyl group having 1 to 4 carbon atoms;

$R^2$ represents an alkyl group having 1 to 4 carbon atoms, an alkoxy group having 1 to 4 carbon atoms or a phenyl group which is optionally substituted with an alkyl or alkoxy group having 1 to 4 carbon atoms;

$R^3$ is optionally linked via an oxygen atom or a sulfur atom and represents an alkyl group having 1 to 20 carbon atoms which is optionally substituted with a phenyl group or a benzyl group which is optionally substituted with an alkoxy group having 1 to 4 carbon atoms;

$R^4$ represents a nitro group or an acyl group represented by X—C(=O)—; and

X represents an aryl group which is optionally substituted with an alkyl group having 1 to 4 carbon atoms, a thienyl group, a morpholino group, a thiophenyl group or a structure represented by the following formula).

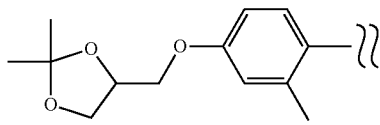

In addition to the above, examples of preferred carbazole oxime ester compound include those described in Japanese Unexamined Patent Application Publication Nos. 2004-359639, 2005-097141, 2005-220097, 2006-160634, 2008-094770 and 2011-80036 and Japanese Translated PCT Patent Application Laid-open Nos. 2008-509967 and 2009-040762.

The content of such oxime ester-based photopolymerization initiator is preferably 0.01 to 5 parts by mass with respect to 100 parts by mass of the above-described carboxyl group-containing resin. When the content is less than 0.01 parts by mass, not only the photocurability on copper becomes insufficient and the coating film is detached, but also the properties of the coating film such as a chemical resistance are deteriorated. Meanwhile, when the content is higher than 5 parts by mass, since light absorption on the surface of the coating film of the resulting solder resist becomes intense, the curability in a deep portion tends to be impaired. The content of the oxime ester-based photopolymerization initiator is more preferably 0.5 to 3 parts by mass.

Specific examples of the α-aminoacetophenone-based photopolymerization initiator include 2-methyl-1-[4-(methylthio)phenyl]-2-morpholinopropanone-1,2-benzyl-2-dimethylamino-1-(4-morpholinophenyl)-butane-1-one, 2-(dimethylamino)-2-[(4-methylphenyl)methyl]-1-[4-(4-morpholinyl)phenyl]-1-butanone and N,N-dimethylaminoacetophenone. Examples of commercially available α-aminoacetophenone-based photopolymerization initiator include IRGACURE 907, IRGACURE 369 and IRGACURE 379, all of which are manufactured by BASF Japan Ltd.

Specific examples of the acylphosphine oxide-based photopolymerization initiator include 2,4,6-trimethylbenzoyl diphenylphosphine oxide, bis(2,4,6-trimethylbenzoyl)-phenylphosphine oxide and bis(2,6-dimethoxybenzoyl)-2,4,4-trimethyl-pentylphosphine oxide. Examples of commercially available acylphosphine oxide-based photopolymerization initiator include LUCIRIN TPO and IRGACURE 819 manufactured by BASF Japan Ltd.

The content of such α-aminoacetophenone-based photopolymerization initiator and acylphosphine oxide-based photopolymerization initiator is preferably 0.01 to 15 parts by mass with respect to 100 parts by mass of the above-described (E) carboxyl group-containing resin. When the content is less than 0.01 parts by mass, not only the photocurability on copper becomes insufficient and the coating film is detached, but also the properties of the coating film such as a chemical resistance are deteriorated. Meanwhile, when the content is higher than 15 parts by mass, an outgas-reducing effect cannot attained and the light absorption on the surface of the coating film becomes intense, so that the curability in a deep portion tends to be impaired. It is more preferably 0.5 to 10 parts by mass.

Further, as the photopolymerization initiator, IRGACURE 389 manufactured by BASF Japan Ltd. can also be suitably used. The content of IRGACURE 389 is suitably 0.1 to 20 parts by mass, more suitably 1 to 15 parts by mass, with respect to 100 parts by mass of the carboxyl group-containing resin.

The above-described photocurable resin composition may also contain a photoinitiator aid and/or a sensitizer in addition to the photopolymerization initiator. Examples of photoinitiator aid and sensitizer that can be suitably used in the photocurable resin composition include benzoin compounds, acetophenone compounds, anthraquinone compounds, thioxanthone compounds, ketal compounds, benzophenone compounds, tertiary amine compounds and xanthone compound.

Specific examples of the benzoin compounds include benzoin, benzoin methyl ether, benzoin ethyl ether and benzoin isopropyl ether.

Specific examples of the acetophenone compounds include acetophenone, 2,2-dimethoxy-2-phenyl acetophenone, 2,2-diethoxy-2-phenyl acetophenone and 1,1-dichloroacetophenone.

Specific examples of the anthraquinone compounds include 2-methylanthraquinone, 2-ethylanthraquinone, 2-t-butylanthraquinone and 1-chloroanthraquinone.

Specific examples of the thioxanthone compounds include 2,4-dimethylthioxanthone, 2,4-diethylthioxanthone, 2-chlorothioxanthone and 2,4-diisopropylthioxanthone.

Specific examples of the ketal compounds include acetophenone dimethyl ketal and benzyldimethyl ketal.

Specific examples of the benzophenone compounds include benzophenone, 4-benzoyldiphenylsulfide, 4-benzoyl-4'-methyldiphenylsulfide, 4-benzoyl-4'-ethyldiphenylsulfide and 4-benzoyl-4'-propyldiphenylsulfide.

Specific examples of the tertiary amine compounds include ethanolamine compounds and compounds having a dialkylaminobenzene structure, and examples of commercially available products thereof include dialkylaminobenzophenones such as 4,4'-dimethylaminobenzophenone (NISSO CURE MABP manufactured by Nippon Soda Co., Ltd.) and 4,4'-diethylaminobenzophenone (EAB manufactured by Hodogaya Chemical Co., Ltd.); dialkylamino group-containing coumarin compounds such as 7-(diethylamino)-4-methyl-2H-1-benzopyran-2-one (7-(diethylamino)-4-methylcoumarin); ethyl-4-dimethylaminobenzoate (KAYACURE EPA manufactured by Nippon Kayaku Co., Ltd.); ethyl-2-dimethylaminobenzoate (QUANTACURE DMB manufactured by International BioSynthetics Ltd.); (n-butoxy)ethyl-4-dimethylaminobenzoate (QUANTACURE BEA manufactured by International BioSynthetics Ltd.); isoamylethyl-p-dimethylaminobenzoate (KAYACURE DMBI manufactured by Nippon Kayaku Co., Ltd.); 2-ethylhexyl-4-dimethylaminobenzoate (ESOLOL 507 manufactured by Van Dyk GmbH); and 4,4'-diethylaminobenzophenone (EAB manufactured by Hodogaya Chemical Co., Ltd.).

Among the above-described compounds, thioxanthone compounds and tertiary amine compounds are preferred. In particular, from the standpoint of the curability of the resulting coating film in a deep portion, it is preferred that a thioxanthone compound such as 2,4-dimethylthioxanthone, 2,4-diethylthioxanthone, 2-chlorothioxanthone or 2,4-diisopropylthioxanthone be incorporated.

The content of such thioxanthone compound is preferably not higher than 20 parts by mass with respect to 100 parts by mass of the above-described (E) carboxyl group-containing resin. When the content of the thioxanthone compound is higher than 20 parts by mass, the thick film curability is deteriorated, leading to an increase in the production cost. The content of the thioxanthone compound is more preferably not higher than 10 parts by mass.

Further, as the tertiary amine compound, those compounds having a dialkylaminobenzene structure are preferred. Thereamong, dialkylaminobenzophenone compounds; and dialkylamino group-containing coumarin compounds that have a maximum absorption wavelength in the range of 350 to 450 nm and ketocumarines are particularly preferred.

As the dialkylaminobenzophenone compound, 4,4'-diethylaminobenzophenone is preferred because of its low toxicity. Since a dialkylamino group-containing coumarin compound has a maximum absorption wavelength in the ultraviolet region of 350 to 410 nm, it causes little coloration, so that not only a colorless and transparent photosensitive composition can be provided, but also a colored solder resist film which reflects the color of a coloring pigment itself can be provided by using a coloring pigment. In particular, 7-(diethylamino)-4-methyl-2H-1-benzopyran-2-one is preferred since it exhibits excellent sensitization effect against a laser beam having a wavelength of 400 to 410 nm.

The content of such tertiary amine compound is preferably 0.1 to 20 parts by mass with respect to 100 parts by mass of the above-described (E) carboxyl group-containing resin. When the content of the tertiary amine compound is less than 0.1 parts by mass, sufficient sensitization effect is not likely to be attained. Meanwhile, when the content is higher than 20 parts by mass, the light absorption by the tertiary amine compound on the surface of a dried coating film of solder resist is increased, so that the curability of the solder resist in a deep portion tends to be impaired. The content of the tertiary amine compound is more preferably 0.1 to 10 parts by mass.

These photopolymerization initiators, photoinitiator aids and sensitizers may be used individually, or two or more thereof may be used in the form of a mixture.

It is preferred that the combined amount of the photopolymerization initiator(s), photoinitiator aid(s) and sensitizer(s) be not more than 35 parts by mass with respect to 100 parts by mass of the above-described (E) carboxyl group-containing resin. When the amount exceeds 35 parts by mass, the light absorption by these components tends to deteriorate the curability of a deep portion.

[(G) Photosensitive Monomer]

A photosensitive monomer is a compound having at least one ethylenically unsaturated group in a molecule. The photosensitive monomer is assisting to photo-cure the carboxyl group-containing resin when irradiated with an active energy ray.

Examples of compounds used as the above-described photosensitive monomer, such as a commonly used and known polyester (meth)acrylate, polyether (meth)acrylate, urethane (meth)acrylate, carbonate (meth)acrylate or epoxy (meth)acrylate may be employed, and specific examples thereof include hydroxyalkyl acrylates such as 2-hydroxyethyl acrylate and 2-hydroxypropyl acrylate; diacrylates of glycol such as ethylene glycol, methoxytetraethylene glycol, polyethylene glycol and propylene glycol; acrylamides such as N,N-dimethylacrylamide, N-methylolacrylamide and N,N-dimethylaminopropylacrylamide; aminoalkyl acrylates such as N,N-dimethylaminoethyl acrylate and N,N-dimethylaminopropyl acrylate; polyvalent acrylates of polyhydric alcohols (e.g. hexanediol, trimethylolpropane, pentaerythritol, dipentaerythritol and tris-hydroxyethyl isocyanurate) or ethylene oxide adducts, propylene oxide adducts or ε-caprolactone adducts of these polyhydric alcohols; polyvalent acrylates such as phenoxyacrylate, bisphenol A diacrylate and ethylene oxide adducts or propylene oxide adducts of these phenols; and polyvalent acrylates of glycidyl ethers such as glycerin diglycidyl ether, glycerin triglycidyl ether, trimethylolpropane triglycidyl ether and triglycidyl isocyanate. In addition to the above, examples also include acrylates and melamine acrylates that are obtained by direct acrylation or diisocyanate-mediated urethane acrylation of a polyol such as polyether polyol, polycarbonate diol, hydroxyl group-terminated polybutadiene or polyester polyol; and/or methacrylates corresponding to the above-described acrylates.

Further, as the photosensitive monomer, for example, an epoxy acrylate resin which is obtained by allowing a polyfunctional epoxy resin such as a cresol novolac-type epoxy resin to react with acrylic acid or an epoxy urethane acrylate compound which is obtained by allowing the hydroxyl group of the above-described epoxy acrylate resin to react with a hydroxyacrylate such as pentaerythritol triacrylate and a half urethane compound of diisocyanate such as isophorone diisocyanate may also be employed. Such an epoxy acrylate-based resin is capable of improving the photocurability of the photosensitive resin composition without impairing the dryness to touch.

The content of the compound having an ethylenically unsaturated group(s) in the molecule used as the above-described photosensitive monomer is preferably 5 to 100 parts by mass, more preferably 5 to 70 parts by mass, with respect to 100 parts by mass of the above-described (E) carboxyl group-containing resin. When the content is less than 5 parts by mass, the photocurability of the photocurable resin composition is impaired. Meanwhile, when the content is higher than 100 parts by mass, the resulting coating film become fragile.

(Thermosetting Component)

The photocurable resin composition according to the present invention may further contain a thermosetting component for the purpose of improving characteristics including a heat resistance and an insulation reliability As the thermosetting component, known and commonly-used thermosetting resins such as an amino resin, an isocyanate compound, a blocked isocyanate compound, a maleimide compound, a benzoxazine compound, an oxazoline compound, a carbodiimide compound, a cyclo carbonate compound, a polyfunctional oxetane compound, an episulfide resin and an epoxy resin can be used.

As the above-described amino resin, examples of amino resins include such as melamine derivatives and benzoguanamine derivatives, such as methylol melamine compounds, methylol benzoguanamine compounds, methylol glycoluril compounds and methylol urea compounds. Moreover, alkoxymethylated melamine compounds, alkoxymethylated benzoguanamine compounds, alkoxymethylated glycoluril compounds and alkoxymethylated urea compounds are obtained by converting the methylol group of the respective methylol melamine compounds, methylol benzoguanamine compounds, methylol glycoluril compounds and methylol urea compounds into an alkoxymethyl group. The type of this alkoxymethyl group is not particularly restricted and examples thereof include methoxymethyl group, ethoxymethyl group, propoxymethyl group and butoxymethyl group. In particular, a melamine derivative having a formalin concentration of not higher than 0.2%, which is not harmful to human body and environment, is preferred.

Examples of commercially available products of the above-described amino resin include CYMEL 300, 301, 303, 370, 325, 327, 701, 266, 267, 238, 1141, 272, 202, 1156, 1158, 1123, 1170, 1174, UFR65 and 300 (all of which are manufactured by MT AquaPolymer, Inc.); and NIKALAC Mx-750, Mx-032, Mx-270, Mx-280, Mx-290, Mx-706, Mx-708, Mx-40, Mx-31, Ms-11, Mw-30, Mw-30HM, Mw-390, Mw-100LM and Mw-750LM (all of which are manufactured by Sanwa Chemical Co., Ltd.).

As the above-described isocyanate compound, a polyisocyanate compound having a plurality of isocyanate groups in a molecule may also be used. As such polyisocyanate compound, for example, an aromatic polyisocyanate, an aliphatic polyisocyanate or an alicyclic polyisocyanate may be employed. Specific examples of the aromatic polyisocyanate include 4,4'-diphenylmethane diisocyanate, 2,4-tolylene diisocyanate, 2,6-tolylene diisocyanate, naphthalene-1,5-diisocyanate, o-xylylene diisocyanate, m-xylylene diisocyanate and 2,4-tolylene dimer. Specific examples of the aliphatic polyisocyanate include tetramethylene diisocyanate, hexamethylene diisocyanate, methylene diisocyanate, trimethylhexamethylene diisocyanate, 4,4-methylenebis(cyclohexylisocyanate) and isophorone diisocyanate. Specific examples of the alicyclic polyisocyanate include bicycloheptane triisocyanate as well as adducts, biurets and isocyanurates of the above-described isocyanate compounds.

A blocked isocyanate group included in the blocked isocyanate compound refers to a group in which isocyanate group is protected and thus temporarily inactivated by a reaction with a blocking agent. When heated to a prescribed temperature, the blocking agent dissociates to yield an isocyanate group.

As the blocked isocyanate compound, a product obtained by an addition reaction between an isocyanate compound and an isocyanate blocking agent may be employed. Examples of an isocyanate compound which can react with a blocking agent include an isocyanurate type, a biuret type and an adduct type and the like. As the isocyanate compound used for synthesizing the blocked isocyanate compound, for example, an aromatic polyisocyanate, an aliphatic polyisocyanate or a cycloaliphatic polyisocyanate may be employed. Specific examples of the aromatic polyisocyanate, the aliphatic polyisocyanate and the cycloaliphatic polyisocyanate include compounds as described above.

Examples of the isocyanate blocking agent include phenolic blocking agents such as phenol, cresol, xylenol, chlorophenol and ethylphenol; lactam-based blocking agents such as ε-caprolactam, δ-valerolactam, γ-butyrolactam and β-propiolactam; activated methylene-based blocking agents such as ethyl acetoacetate and acetylacetone; alcohol-based blocking agents such as methanol, ethanol, propanol, butanol, amyl alcohol, ethylene glycol monomethyl ether, ethylene glycol monoethyl ether, ethylene glycol monobutyl ether, diethylene glycol monomethyl ether, propylene glycol monomethyl ether, benzyl ether, methyl glycolate, butyl glycolate, diacetone alcohol, methyl lactate and ethyl lactate; oxime-based blocking agents such as formaldehyde oxime, acetaldoxime, acetoxime, methylethyl ketoxime, diacetyl monooxime and cyclohexane oxime; mercaptan-based blocking agents such as butylmercaptan, hexylmercaptan, t-butylmercaptan, thiophenol, methylthiophenol and ethylthiophenol; acid amid-based blocking agents such as acetic acid amide and benzamide; imide-based blocking agents such as succinic acid imide and maleic acid imide; amine-based blocking agents such as xylidine, aniline, butylamine and dibutylamine; imidazole-based blocking agents such as imidazole and 2-ethylimidazole; and imine-based blocking agents such as methyleneimine and propyleneimine.

The blocked isocyanate compound may be a commercially available product and examples thereof include SUMIDUR BL-3175, BL-4165, BL-1100 and BL-1265, DESMODUR TPLS-2957, TPLS-2062, TPLS-2078 and TPLS-2117 and DESMOTHERM 2170 and 2265 (all of which are manufactured by Sumitomo Bayer Urethane Co., Ltd.); CORONATE 2512, CORONATE 2513 and CORONATE 2520 (all of which are manufactured by Nippon Polyurethane Industry Co., Ltd.); B-830, B-815, B-846, B-870, B-874 and B-882 (all of which are manufactured by Mitsui Takeda Chemicals Inc.); and TPA-B80E, 17B-60PX and E402-B80T (all of which are manufactured by Asahi Kasei Chemicals Corporation). It is noted here that SUMIDUR BL-3175 and BL-4265 are produced by using methylethyl oxime as a blocking agent.

The content of the above-described polyisocyanate compound or blocked isocyanate compound is preferably 1 to 100 parts by mass, more preferably 2 to 70 parts by mass, with respect to 100 parts by mass of the above-described (E) carboxyl group-containing resin. When the content is less than 1 parts by mass, since a coating film having sufficient toughness may not be obtained, the content is not preferable. Meanwhile, when the content is higher than 100 parts by mass, since the storage stability is deteriorated, the content is not preferable.

An urethanization catalyst can be further added to the above-described photocurable resin composition. As the urethanization catalyst, one or more urethanization catalysts selected from the group consisting of tin-based catalysts, metal chlorides, metal acetylacetonates, metal sulfates, amine compounds, and/or amine salts are preferably used.

The above-described tin-based catalysts include, e.g., organotin compounds such as stannous octoate and dibutyltin dilaurate, inorganic tin compounds, and the like.

The above-described metal chlorides are chlorides of metals selected from the group consisting of Cr, Mn, Co, Ni, Fe, Cu, and Al and include, e.g., cobaltic chloride, nickelous chloride, ferric chloride, and the like.

The above-described metal acetylacetonates are acetylacetonates of metals selected from the group consisting of Cr, Mn, Co, Ni, Fe, Cu, and Al and include, e.g., cobalt acetylacetonates, nickel acetylacetonates, iron acetylacetonates, and the like.

The above-described metal sulfates are sulfates of metals selected from the group consisting of Cr, Mn, Co, Ni, Fe, Cu, and Al and include, e.g., copper sulfate and the like.

The maleimide compounds include polyfunctional aliphatic/alicyclic maleimides and polyfunctional aromatic maleimides. The polyfunctional aliphatic/alicyclic maleimides are, e.g., N,N'-methylenebismaleimide, N,N'-ethylenebismaleimide, isocyanuric skeleton polymaleimides such as isocyanurate skeleton-containing maleimide ester compounds obtained by dehydration esterification of tris(hydroxyethyl)isocyanurate with aliphatic/alicyclic maleimidocarboxylic acids and isocyanurate skeleton-containing maleimide urethane compounds obtained by urethanization of tris(carbamatehexyl)isocyanurate with aliphatic/alicyclic maleimide alcohols; isophorone bisurethane bis(N-ethylmaleimide), triethyleneglycol bis(maleimidoethyl carbonate), aliphatic/alicyclic polymaleimide ester compounds obtained by dehydration esterification of aliphatic/alicyclic maleimidocarboxylic acids with various aliphatic/alicyclic polyols or transesterification of aliphatic/alicyclic maleimidocarboxylates with various aliphatic/alicyclic polyols; aliphatic/alicyclic polymaleimide ester compounds obtained by ether ring-opening reaction of aliphatic/alicyclic maleimidocarboxylic acids with various aliphatic/alicyclic polyepoxides; aliphatic/alicyclic polymaleimide urethane compounds obtained by urethanization reaction of aliphatic/alicyclic maleimide alcohols with various aliphatic/alicyclic polyisocyanates; and the like.

The polyfunctional aromatic maleimides are aromatic polyfunctional maleimides such as aromatic polymaleimide ester compounds obtained by dehydration esterification of maleimidocarboxylic acids with various aromatic polyols or transesterification of maleimidocarboxylates with various aromatic polyols, aromatic polymaleimide ester compounds obtained by ether ring-opening reaction of maleimidocarboxylic acids with various aromatic polyepoxides, and aromatic polymaleimide urethane compounds obtained by urethanization reaction of maleimide alcohols with various aromatic polyisocyanates; and the like.

Specific examples of the polyfunctional aromatic maleimides may include, e.g., N,N'-(4,4'-diphenylmethane)bismaleimide, N,N'-2,4-tolylenebismaleimide, N,N'-2,6-tolylenebismaleimide, 1-methyl-2,4-bismaleimidebenzene, N,N'-m-phenylenebismaleimide, N,N'-p-phenylenebismaleimide, N,N'-m-toluylenebismaleimide, N,N'-4,4'-biphenylenebismaleimide, N,N'-4,4'-[3,3'-dimethyl-biphenylene]bismaleimide, N,N'-4,4'-[3,3'-dimethyldiphenylmethane]bismaleimide, N,N'-4,4'-[3,3'-diethyldiphenylmethane]bismaleimide, N,N'-4,4'-diphenylmethanebismaleimide, N,N'-4,4'-diphenylpropanebismaleimide, N,N'-4,4'-diphenyletherbismaleimide, N,N'-3,3'-diphenylsulfonebismaleimide, N,N'-4,4'-diphenylsulfonebismaleimide, 2,2-bis[4-(4-maleimidephenoxy)phenyl]propane, 2,2-bis[3-t-butyl-4-(4-maleimidephenoxy)phenyl]propane, 2,2-bis[3-s-butyl-4-(4-maleimidephenoxy)phenyl]propane, 1,1-bis[4-(4-maleimidephenoxy)phenyl]decane, 1,1-bis[2-methyl-4-(4-maleimidephenoxy)-5-t-butylphenyl]-2-methylpropane, 4,4'-cyclohexylidene-bis[1-(4-maleimidephenoxy)-2-(1,1-dimethylethyl)benzene], 4,4'-methylene-bis[1-(4-maleimidephenoxy)-2,6-bis(1,1-dimethylethyl)benzene], 4,4'-methylene-bis[1-(4-maleimidephenoxy)-2,6-di-s-butylbenzene], 4,4'-cyclohexylidene-bis[1-(4-maleimidephenoxy)-2-cyclohexylbenzene], 4,4'-methylenebis[1-(maleimidephenoxy)-2-nonylbenzene], 4,4'-(1-methylethylidene)-bis[1-(maleimidephenoxy)-2,6-bis(1,1-dimethylethyl)benzene], 4,4'-(2-ethylhexylidene)-bis[1-(maleimidephenoxy)-benzene], 4,4'-(1-methylheptylidene)-bis[1-(maleimidephenoxy)-benzene], 4,4'-cyclohexylidene-bis[1-(maleimidephenoxy)-3-methylbenzene], 2,2-bis[4-(4-maleimidephenoxy)phenyl]hexafluoropropane, 2,2-bis[3-methyl-4-(4-maleimidephenoxy)phenyl]propane, 2,2-bis[3-methyl-4-(4-maleimidephenoxy)phenyl]hexafluoropropane, 2,2-bis[3,5-dimethyl-4-(4-maleimidephenoxy)phenyl]propane, 2,2-bis[3,5-dimethyl-4-(4-maleimidephenoxy)phenyl]hexafluoropropane, 2,2-bis[3-ethyl-4-(4-maleimidephenoxy)phenyl]propane, 2,2-bis[3-ethyl-4-(4-maleimidephenoxy)phenyl]hexafluoropropane, bis[3-methyl-(4-maleimidephenoxy)phenyl]methane, bis[3,5-dimethyl-(4-maleimidephenoxy)phenyl]methane, bis[3-ethyl-(4-maleimidephenoxy)phenyl]methane, 3,8-bis[4-(4-maleimidephenoxy)phenyl]-tricyclo[5.2.1.0$^{2,6}$]decane, 4,8-bis[4-(4-maleimidephenoxy)phenyl]-tricyclo[5.2.1.0$^{2,6}$]decane, 3,9-bis[4-(4-maleimidephenoxy)phenyl]-tricyclo[5.2.1.0$^{2,6}$]decane, 4,9-bis[4-(4-maleimidephenoxy)phenyl]-tricyclo[5.2.1.0$^{2,6}$]decane, 1,8-bis[4-(4-maleimidephenoxy)phenyl]menthane, 1,8-bis[3-methyl-4-(4-maleimidephenoxy)phenyl]menthane, 1,8-bis[3,5-dimethyl-4-(4-maleimidephenoxy)phenyl]menthane, and the like.

Commercially available products of the maleimide compounds may include, e.g., BMI-1000, BMI-1000H, BMI-1000S, BMI-1100, BMI-1100H, BMI-2000, BMI-2300, BMI-3000, BMI-3000H, BMI-4000, BMI-5100, BMI-7000, BMI-7000H, and BMI-TMH (all manufactured by DAIWA KASEI KOGYO CO, LTD.); MIA-200 (manufactured by DIC Corporation); and the like.

As these bismaleimide derivatives, which may be synthesized by a usual method, commercially available products may also be used. Especially, among the bismaleimide derivatives, those containing no halogen atom in a molecule are preferred from the viewpoint of eliminating loads to the environment. One of them may be used alone or two or more thereof may be used in combination.

Such benzoxazine compounds as described above include bisphenol A type benzoxazine, bisphenol F type benzoxazine, bisphenol S type benzoxazine, and the like. These commercially available products may include "F-a" (manufactured by SHIKOKU CHEMICALS CORPORATION).

Such oxazoline compounds as described above are not particularly limited if containing an oxazoline group. Commercially available products thereof include Epocros (manufactured by NIPPON SHOKUBAI CO., LTD.) K-2010E, K-2020E, K-2030E, WS-500, WS-700, and RPS-1005.

Such carbodiimide compounds as described above include dicyclohexylcarbodiimide, diisopropylcarbodiimide, and the like.

The cyclocarbonate compound is not particularly limited if being a cyclic compound and having a carbonate bond.

Examples thereof include alkylene carbonate compounds having polyfunctional structures.

Such polyfunctional oxetane compounds as described above include polyfunctional oxetanes such as bis[(3-methyl-3-oxetanylmethoxy)methyl]ether, bis[(3-ethyl-3-oxetanylmethoxy)methyl]ether, 1,4-bis[(3-methyl-3-oxetanylmethoxy)methyl]benzene, 1,4-bis[(3-ethyl-3-oxetanylmethoxy)methyl]benzene, (3-methyl-3-oxetanyl)methylacrylate, (3-ethyl-3-oxetanyl)methylacrylate, (3-methyl-3-oxetanyl)methylmethacrylate, (3-ethyl-3-oxetanyl)methylmethacrylate, and oligomers and copolymers thereof; also etherified products of oxetane alcohols with novolac resins or hydroxyl group-containing resins such as poly(p-hydroxystyrene), cardo type bisphenols, calixarenes, calixresorcinarenes, and silsesquioxanes; and the like. In addition, a copolymer of an unsaturated monomer having an oxetane ring with alkyl(meth)acrylate is also included.

Such episulfide resins as described above include, e.g., YL7000 (bisphenol A type episulfide resin) manufactured by Mitsubishi Chemical Corporation; and YSLV-120TE manufactured by NIPPON STEEL & SUMIKIN CHEMICAL CO., LTD. Further, an episulfide resin in which the oxygen atom in the epoxy group of a novolac type epoxy resin is replaced with a sulfur atom using the same synthetic method; and/or the like may also be used.

As the above-described epoxy resin, a polyfunctional epoxy resin, known in the art, having at least two epoxy groups in one molecule may be used. The epoxy resin may be liquid, solid, or semisolid.

Examples of epoxy compounds include, but not limited to, bisphenol A-type epoxy resins such as jER828, jER834, jER1001 and jER1004, which are manufactured by Mitsubishi Chemical Corporation, EPICLON 840, EPICLON 850, EPICLON 1050 and EPICLON 2055, which are manufactured by DIC Corporation, EPOTOHTO YD-011, YD-013, YD-127 and YD-128, which are manufactured by NIPPON STEEL & SUMIKIN CHEMICAL CO., LTD., D.E.R.317, D.E.R.331, D.E.R.661 and D.E.R.664, which are manufactured by The Dow Chemical Company, Araldite 6071, Araldite 6084, Araldite GY250 and Araldite GY260, which are manufactured by BASF Japan Ltd., SUMI-EPDXY ESA-011, ESA-014, ELA-115 and ELA-128, which are manufactured by Sumitomo Chemical Co., Ltd., and A.E.R.330, A.E.R.331, A.E.R.661 and A.E.R.664, which are manufactured by Asahi Kasei Corporation. (all of the above are trade names); brominated epoxy resins such as jERYL903 manufactured by Mitsubishi Chemical Corporation, EPICLON 152 and EPICLON 165, which are manufactured by DIC Corporation, EPOTOHTO YDB-400 and YDB-500, which are manufactured by NIPPON STEEL & SUMIKIN CHEMICAL CO., LTD., D.E.R.542 manufactured by The Dow Chemical Company, Araldite 8011 manufactured by BASF Japan Ltd., SUMI-EPDXY ESB-400 and ESB-700, which are manufactured by Sumitomo Chemical Co., Ltd., and A.E.R.711 and A.E.R.714, which are manufactured by Asahi Kasei Corporation. (all of the above are trade names); novolac-type epoxy resins such as jER152 and jER154, which are manufactured by Mitsubishi Chemical Corporation, D.E.N.431 and D.E.N.438, which are manufactured by The Dow Chemical Company, EPICLON N-730, EPICLON N-770 and EPICLON N-865, which are manufactured by DIC Corporation, EPOTOHTO YDCN-701 and YDCN-704, which are manufactured by NIPPON STEEL & SUMIKIN CHEMICAL CO., LTD., Araldite ECN1235, Araldite ECN1273, Araldite ECN1299 and Araldite XPY307, which are manufactured by BASF Japan Ltd., EPPN-201, EOCN-1025, EOCN-1020, EOCN-104S, RE-306 and NC-3000, which are manufactured by Nippon Kayaku Co., Ltd., SUMI-EPDXY ESCN-195X and ESCN-220, which are manufactured by Sumitomo Chemical Co., Ltd., A.E.R.ECN-235 and ECN-299, which are manufactured by Asahi Kasei Corporation, YDCN-700-2, YDCN-700-3, YDCN-700-5, YDCN-700-7, YDCN-700-10, YDCN-704 and YDCN-704A, which are manufactured by NIPPON STEEL & SUMIKIN CHEMICAL CO., LTD., and EPICLON N-680, N-690 and N-695, which are manufactured by DIC Corporation, (all of the above are trade names); bisphenol F-type epoxy resins such as EPICLON 830 manufactured by DIC Corporation, jER807 manufactured by Mitsubishi Chemical Corporation, and EPOTOHTO YDF-170, YDF-175 and YDF-2004 which are manufactured by NIPPON STEEL & SUMIKIN CHEMICAL CO., LTD. and Araldite XPY306 manufactured by BASF Japan Ltd. (all of the above are trade names); hydrogenated bisphenol A-type epoxy resins such as EPOTOHTO ST-2004, ST-2007 and ST-3000 (trade names) which are manufactured by NIPPON STEEL & SUMIKIN CHEMICAL CO., LTD.; glycidyl amine-type epoxy resins such as jER604 manufactured by Mitsubishi Chemical Corporation, EPOTOHTO YH-434 manufactured by NIPPON STEEL & SUMIKIN CHEMICAL CO., LTD., Araldite MY720 manufactured by BASF Japan Ltd. and SUMI-EPDXY ELM-120 manufactured by Sumitomo Chemical Co., Ltd. (all of the above are trade names); hydantoin-type epoxy resins such as Araldite CY-350 manufactured by BASF Japan Ltd. (the trade name); alicyclic epoxy resins such as CELLOXIDE 2021 manufactured by Daicel Corporation, and Araldite CY-175 and CY179, which are manufactured by BASF Japan Ltd. (all of the above are trade names); trihydroxyphenyl methane-type epoxy resins such as YL-933 manufactured by Mitsubishi Chemical Corporation and T.E.N., EPPN-501 and EPPN-502, which are manufactured by The Dow Chemical Company (all of the above are trade names); bixylenol-type or biphenol-type epoxy resins and mixtures thereof, such as YL-6056, YX-4000 and YL-6121 (all of which are trade names) manufactured by Mitsubishi Chemical Corporation; bisphenol S-type epoxy resins such as EBPS-200 manufactured by Nippon Kayaku Co., Ltd., EPX-30 manufactured by ADEKA CORPORATION and EXA-1514 (trade name) manufactured by DIC Corporation; bisphenol A novolac-type epoxy resins such as jER157S (trade name) manufactured by Mitsubishi Chemical Corporation; tetraphenylolethane-type epoxy resins such as jERYL-931 manufactured by Mitsubishi Chemical Corporation and Araldite 163 manufactured by BASF Japan Ltd. (all of the above are trade names); heterocyclic epoxy resins such as Araldite PT810 manufactured by BASF Japan Ltd. and TEPIC manufactured by Nissan Chemical Industries, Ltd. (all of the above are trade names); diglycidyl phthalate resins such as BLEMMER DGT manufactured by NOF Corporation; tetraglycidyl xylenoylethane resins such as ZX-1063 manufactured by NIPPON STEEL & SUMIKIN CHEMICAL CO., LTD.; naphthalene group-containing epoxy resins such as ESN-190 and ESN-360, which are manufactured by NIPPON STEEL & SUMIKIN CHEMICAL CO., LTD., and HP-4032, EXA-4750 and EXA-4700, which are manufactured by DIC Corporation; epoxy resins having a dicyclopentadiene skeleton, such as HP-7200 and HP-7200H manufactured by DIC Corporation; glycidyl methacrylate copolymer-based epoxy resins such as CP-50S and CP-50M manufactured by NOF Corporation; cyclohexylmaleimide-glycidyl methacrylate copolymer epoxy resins; and CTBN-modified epoxy resins (for example, YR-102 and YR-450 manufactured by NIPPON STEEL & SUMIKIN CHEMICAL CO., LTD.). Among them, bisphenol A-type epoxy resins, naphthalene-type epoxy resins, phenol novolac-type epoxy resins, biphenol-type epoxy resins, or mixtures thereof are particularly preferred.

These epoxy resins may be used individually, or two or more thereof may be used in combination.

(Thermosetting Catalyst)

In cases where the above-described thermosetting component is contained, it is preferred that thermosetting catalyst is further contained. Examples of the thermosetting catalyst include imidazole derivatives such as imidazole, 2-methylimidazole, 2-ethylimidazole, 2-ethyl-4-methylimidazole, 2-phenylimidazole, 4-phenylimidazole, 1-cyanoethyl-2-phenylimidazole and 1-(2-cyanoethyl)-2-ethyl-4-methylimidazole; amine compounds such as dicyandiamide, benzyldimethylamine, 4-(dimethylamino)-N,N-dimethylbenzylamine, 4-methoxy-N,N-dimethylbenzylamine and 4-methyl-N,N-dimethylbenzylamine; hydrazine compounds such as adipic acid dihydrazide and sebacic acid dihydrazide; and phosphorus compounds such as triphenylphosphine. Further, examples of commercially available thermosetting catalyst include 2MZ-A, 2MZ-OK, 2PHZ, 2P4BHZ and 2P4MHZ (all of which are imidazole-based compounds; trade names), which are manufactured by SHIKOKU CHEMICALS CORPORATION; and U-CAT (registered trademark) 3503N and U-CAT 3502T (both of which are blocked isocyanate compounds of dimethylamine; trade names) and DBU, DBN, U-CATSA102 and U-CAT5002 (all of which are a bicyclic amidine compound or a salt thereof), which are manufactured by San-Apro Ltd. The thermosetting catalyst is not particularly restricted to these catalysts and it may be a thermosetting catalyst of an epoxy resin or an oxetane compound, or any compound which facilitates the reaction of at least either of an epoxy group and an oxetanyl group with a carboxyl group. These thermosetting catalysts may be used individually, or two or more thereof may be used in combination. Further, a s-triazine derivative, such as guanamine, acetoguanamine, benzoguanamine, melamine, 2,4-diamino-6-methacryloyloxyethyl-s-triazine, 2-vinyl-2,4-diamino-s-triazine, 2-vinyl-4,6-diamino-s-triazine-isocyanuric acid adduct or 2,4-diamino-6-methacryloyloxyethyl-s-triazine isocyanuric acid adduct, may also be used. Preferably, such compound which also functions as an adhesion-imparting agent is used in combination with a thermosetting catalyst.

The content of the thermosetting catalyst(s) is preferably 0.1 to 20 parts by mass, more preferably 0.5 to 15.0 parts by mass, with respect to 100 parts by mass of the above-described thermosetting component.

(Inorganic Filler)

As the above-described inorganic filler, a known and commonly-used inorganic filler may be used. In particular, inorganic fillers such as a silica, an alumina (aluminum oxide), a boron nitride, a barium sulfate, a talc and Neuburg siliceous are preferably used. In addition, an aluminum hydroxide, a magnesium hydroxide, a boehmite and the like may be also used for the purpose of adding flame retardancy. Furthermore, a compound having one or more ethylenically unsaturated groups, NANOCRYL (trade name) XP 0396, XP 0596, XP 0733, XP 0746, XP 0765, XP 0768, XP 0953, XP 0954, and XP 1045 (all are product grade names) manufactured by Evonik Hanse GmbH, in which nanosilica is dispersed in the above-described polyfunctional epoxy resin, and NANOPDX (trade name) XP 0516, XP 0525, and XP 0314 (all are product grade names) manufactured by Evonik Hanse GmbH may also be used.

The above-described silica and alumina are preferably sphere-shaped. The average particle diameter (D50) of a spherical silica is preferably 0.1 to 10 µm. The average particle diameter of a spherical alumina is preferably 0.1 to 20 µm. The average particle diameter is measured by laser diffractometry. In addition, a sphericity of the spherical silica and spherical alumina is not less than 0.8. It is preferred that the surface of the spherical silica and spherical alumina is treated with a silane coupling agent. The sphericity is measured as described below. It is calculated as a value calculated by (sphericity)=$[4\pi \times (area)/(boundary\ length)^2]$, from the area and boundary length of an observed particle from a photograph with SEM. Specifically, an average value measured for 100 particles using an image processing device is adopted.

Commercially available spherical silicas include SO series manufactured by Admatechs Company Limited; HPS series (such as HPS-0500, HPS-1000, and HPS3500) manufactured by TOAGOSEI CO., LTD.; and the like.

Commercially available spherical aluminas include AO series manufactured by Admatechs Company Limited; TC-975c manufactured by Admatechs Company Limited; ALUNABEADS/CB series manufactured by SHOWA DENKO K.K.; and the like.

In addition to the above-described components, the component as described below may also be added arbitrarily to a photocurable resin composition for forming the layer (L1).

The above-described layer (L2) is a thermosetting resin composition layer formed by applying and drying a thermosetting resin composition. In the layer, after laminating the dry film according to the present invention on a substrate, the resultant is cured by a thermal treatment, and then patterning can be performed by laser processing.

It is preferred that the thermosetting resin composition constituting the above-described layer (L2) includes, (A) an epoxy resin, (B) an epoxy curing agent and (C) an inorganic filler. In addition, it is preferred that the thermosetting resin composition further includes (D) a thermoplastic resin composition.

[(A) Epoxy Resin]

(A) a epoxy resin may include the same as the above-described epoxy resin. In particular, a bisphenol A-type epoxy resin, a naphthol-type epoxy resin, a cresol novolak-type epoxy resin, a phenol novolak-type epoxy resin, or a mixture thereof is preferred.

Such epoxy resins may be used individually, or two or more thereof may be used in combination.

The content of (A) the epoxy resin in a composition is preferably 15 to 80% by mass, more preferably 15 to 60% by mass, based on the total solid contents of a thermosetting resin composition for forming the layer (L2).

[(B) Curing Agent for Epoxy Resin]

As the curing agent for (B) an epoxy resin, which is a compound having a group reacting with an epoxy group, any known curing agent for an epoxy resin may be used. Such curing agents for an epoxy resin include polyfunctional phenolic compounds, polycarboxylic acids and acid anhydrides thereof, cyanate ester resins, active ester resins, aliphatic or aromatic, primary or secondary amines, polyamide resins, polymercapto compounds, and the like. Among them, polyfunctional phenolic compounds, polycarboxylic acids and acid anhydrides thereof, cyanate ester resins, and active ester resins are preferred, and polyfunctional phenolic compounds are more preferred.

As the above-described polyfunctional phenolic compound, which is preferably a polyfunctional phenolic compound having two or more phenolic hydroxyl groups in one molecule, a polyfunctional phenolic compound known in the art may be used. Specifically, such polyfunctional phenolic compounds include phenol novolac resins, cresol novolac resins, bisphenol A, allylated bisphenol A, bisphenol F, bisphenol A novolac resins, vinylphenol copolymer resins, and the like. Also, the polyfunctional phenolic compound may be a triazine ring-containing novolac resin which is a polycondensation product of each phenol, an aldehyde, and a compound having a triazine ring. Among the phenolic compounds, phenolic resins are preferred, and phenol novolac resins are more preferred because of having high reactivity and a high effect of increasing a heat resistance. Commercially available polyfunctional phenolic compounds used as the curing agents for an epoxy resin include, e.g., cresol novolac resins such as GPX-41 manufactured by Gifu Shellac Manufacturing Co., Ltd.; trisphenol methane type phenolic resins such as MEH-7500H manufactured by Meiwa Plastic Industries, Ltd.; biphenyl-aralkyl type phenolic resins such as MEH-7851-4H manufactured by Meiwa Plastic Industries, Ltd.; phenol novolac resins such as HF-1M H60 manufactured by Meiwa Plastic Industries, Ltd.; and the like.

The above-described polycarboxylic acids and acid anhydrides thereof are compounds having two or more carboxyl groups in one molecule and acid anhydrides thereof and include, e.g., (meth)acrylic acid copolymers, maleic anhydride copolymers, dibasic acid condensation products, and the like as well as resins having carboxylic acid terminals such as carboxylic acid-terminated imide resins. Commercially available products include JONCRYL (product group name) manufactured by BASF Japan Ltd.; SMA Resins (product group names) manufactured by Sartomer Company; polyazelaic polyanhydride manufactured by New Japan Chemical Co., Ltd.; carboxylic acid-terminated polyimide resins such as V-8000 and V-8002 manufactured by DIC Corporation; and the like.

The above-described cyanate ester resins are compounds having two or more cyanate ester groups (—OCN) in one molecule. Any known cyanate ester resins may be used. The cyanate ester resins include, e.g., phenol novolac type cyanate ester resins, alkylphenol novolac type cyanate ester resins, dicyclopentadiene type cyanate ester resins, bisphenol A type cyanate ester resins, bisphenol F type cyanate ester resins, and bisphenol S type cyanate ester resins. Such a cyanate ester resin may also be a prepolymer having a portion made to be a triazine. Commercially available products of the cyanate ester resins include a phenol novolac type polyfunctional cyanate ester resin, PT30, manufactured by Lonza Japan.; a bisphenol A type dicyanate prepolymer having a portion made to be a triazine, BA230, manufactured by Lonza Japan.; dicyclopentadiene structure-containing cyanate ester resins, DT-4000 and DT-7000, manufactured by Lonza Japan, Ltd.; and the like.

The above-described active ester resins are resins having two or more active ester groups in one molecule. Generally, an active ester resin can be obtained by condensation reaction of a carboxylic compound with a hydroxy compound. Especially, an active ester compound obtained using a phenolic compound or a naphthol compound is preferred as the hydroxy compound. Such phenolic or naphthol compounds include hydroquinone, resorcin, bisphenol A, bisphenol F, bisphenol S, phenolphthalin, methylated bisphenol A, methylated bisphenol F, methylated bisphenol S, phenol, o-cresol, m-cresol, p-cresol, catechol, α-naphthol, β-naphthol, 1,5-dihydroxynaphthalene, 1,6-dihydroxynaphthalene, 2,6-dihydroxynaphthalene, dihydroxybenzophenone, trihydroxybenzophenone, tetrahydroxybenzophenone, phloroglucin, benzenetriol, dicyclopentadienyldiphenol, phenol-novolac, and the like. Commercially available active ester compounds include, e.g., EXB-9451 and EXB-9460 manufactured by DIC Corporation; DC808 and YLH1030 manufactured by Mitsubishi Chemical Corporation; and the like.

In the content of (B) the curing agent for an epoxy resin, the ratio of the number of moles of the epoxy group and the number of moles of the group reacting with the epoxy group in the curing agent is preferably 3:1 to 0.75:1, more preferably 2.5:1 to 1:1, particularly preferably 2.3:1 to 1.1:1. When the ratio is outside 3:1 to 0.75:1, there is a fear that a laminate property and an insulation reliability are deteriorated.

[(C) Inorganic Filler]

The above-described (C) inorganic filler may include the same as the above-described inorganic filler. The content of (C) the inorganic filler in a thermosetting resin composition for forming the layer (L2) is preferably 30 to 80% by mass based on the total solid contents of the thermosetting resin composition for forming the layer (L2).

[(D) Thermoplastic Resin]

The above-described thermoplastic resin (binding polymer) is contained for the purpose of improving a flexible property and a tackiness (dry feeling by finger touch) of an obtained cured product. A known and commonly-used thermoplastic resin may be used. As the thermoplastic resin, a cellulose-based resin, a polyester-based resin and a phenoxy resin are preferred. A cellulose-based resin include cellulose acetate butyrate (CAB) and cellulose acetate propionate (CAP) series which are manufactured by Eastman Chemical Company. It is preferred that a polyester-based resin include VYLON series manufactured by TOYOBO CO., LTD. and a phenoxy resin include bisphenol A-type, bisphenol F-type and a hydrogenated compound thereof. The weight-average molecular weight (Mw) of (D) the thermoplastic resin is preferably 5,000 or larger, more preferably 5,000 to 100,000.

The content of the above-described (D) thermoplastic resin is preferably not more than 50% by mass, more preferably 1 to 50% by mass, particularly preferably 5 to 35% by mass, based on the total solid contents of a thermosetting resin composition for forming a thermosetting resin composition layer.

An excellent laminate property and a residue removability of an opening part are exhibited by containing the thermoplastic resin in this range.

(Block Copolymer)

In the above-described thermosetting resin composition for forming the layer (L2), a block copolymer may be preferably contained. The term "block copolymer" refers to a copolymer having a molecular structure in which two or more polymers having different properties are connected by covalent bonds in the form of a long chain. It is preferably a solid in the range of 20° C. to 30° C. Within this scope, the block copolymer may be a solid, and the block copolymer may also be a solid at a temperature corresponding to outside of this scope. With the block copolymer being a solid in the above-described temperature range, when the thermosetting resin composition is made into a dry film or coated and pre-dried on a substrate, an excellent tack property can be attained.

As a block copolymer used in the present invention, a black copolymer of X—Y-X-type or X-Y-X'-type is preferred. Among X-Y-X-type and X-Y-X'-type black copolymers, a block copolymer constituted by a middle polymer unit Y which is a soft block having a low grass transition temperature (Tg) (preferably lower than 0° C.) and an outer polymer unit X or X' which is a hard block having a high Tg (preferably 0° C. or higher) is preferred. The glass transition temperature Tg is measured by differential scanning calorimetry (DSC).

Further, among X-Y-X-type and X-Y-X'-type block copolymers, a block copolymer constituted by a polymer unit X or X' having a Tg of not lower than 50° C. and a polymer unit Y having a Tg of not higher than −20° C. is more preferred.

Still further, among X-Y-X-type and X-Y-X'-type block copolymers, one in which X or X' has a high compatibility with the above-described (A) epoxy resin and Y has a low compatibility with the above-described (A) epoxy resin is also preferred. It is believed that a block copolymer whose outer blocks are compatible with a matrix and a middle block is incompatible with the matrix in this manner is likely to exhibit a specific structure in the matrix.

It is preferred that the block copolymer contain, for example, polymethyl (meth)acrylate (PMMA) or polystyrene (PS) as the X or X' and poly-n-butylacrylate (PBA) or polybutadiene (PB) as the Y. In addition, by introducing a hydrophilic unit having an excellent compatibility with the above-described carboxyl group-containing resin, which is represented by a styrene unit, a hydroxyl group-containing unit, a carboxyl group-containing unit, an epoxy-containing unit, an N-substituted acrylamide unit or the like, to a part of the component X or X', the compatibility of the block copolymer can be further improved.

Commercially available products of the block copolymers include an acrylic triblock copolymer produced using living polymerization, manufactured by Arkema. Mention is made of SBM types represented by polystyrene-polybutadiene-polymethyl methacrylate; MAM types represented by polymethyl methacrylate-polybutylacrylate-polymethyl methacrylate; and, in addition, MAM N types and MAM A types subjected to carboxylic acid modification or hydrophilic group modification treatment. The SBM types include E41, E40, E21, E20, and the like; the MAM types include M51, M52, M53, M22, and the like; the MAM N types include 52N and 22N; and the MAM A types include SM4032XM10 and the like. Also, KURARITY manufactured by KURARAY CO., LTD. is a block copolymer derived from methyl methacrylate and butyl acrylate.

Further, as the block copolymer used in the present invention, a ternary or higher order block copolymer is preferred and a block copolymer which is synthesized by a living polymerization method and has a precisely controlled molecular structure is more preferred from the standpoint of attaining the effects of the present invention. This is thought to be because a block copolymer synthesized by a living polymerization method has a narrow molecular weight distribution and, therefore, the characteristics of each unit are clear. The molecular weight distribution (Mw/Mn) of the block copolymer to be used is preferably not greater than 3, more preferably not greater than 2.5, still more preferably not greater than 2.0.

Such a block copolymer containing a (meth)acrylate polymer block as described in the above can be suitably obtained by, for example, those methods that are described in Japanese Unexamined Patent Application Publication Nos. 2007-516326 and 2005-515281 (Specification), particularly by polymerizing a Y unit using an alkoxyamine compound represented by any one of the following formulae (1) to (4) as an initiator and then polymerizing an X unit thereto.

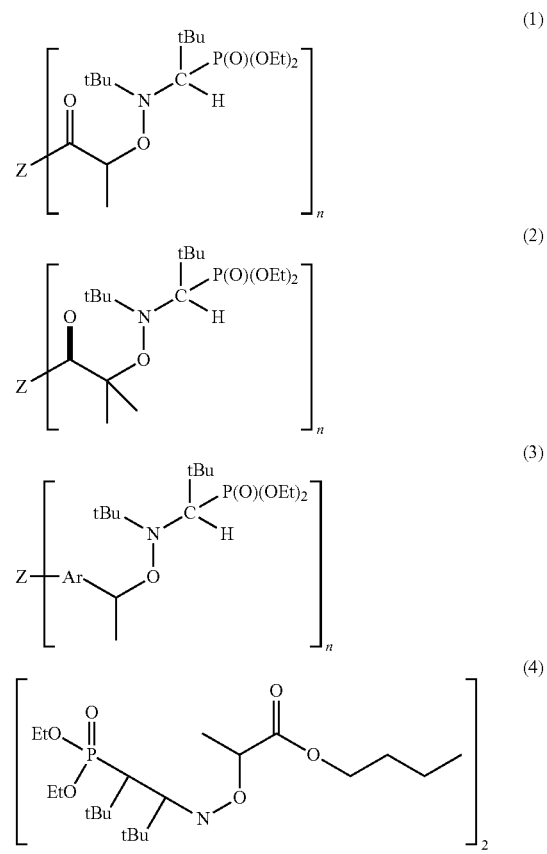

(wherein, n represents 2; Z represents a divalent organic group, preferably one selected from 1,2-ethanedioxy, 1,3-propanedioxy, 1,4-butanedioxy, 1,6-hexanedioxy, 1,3,5-tris (2-ethoxy)cyanuric acid, polyaminoamines such as polyethyleneamine, 1,3,5-tris(2-ethylamino)cyanuric acid, polythioxy, phosphonate and polyphosphonate; and Ar represents a divalent aryl group)

The weight-average molecular weight of the block copolymer is in the range of preferably 20,000 to 400,000, more preferably 50,000 to 300,000. When the weight-average molecular weight is less than 20,000, a desired toughness and the effects of having flexibility cannot be attained, so that the tack property becomes poor when the thermosetting resin composition is made into a dry film or applied onto a substrate and pre-dried. Meanwhile, when the weight-average molecular weight is higher than 400,000, the viscosity of the thermosetting resin composition is increased, so that the printing property and processability may be considerably deteriorated. When the weight-average molecular weight is 50,000 or higher, an excellent effect can be attained in terms of the property of alleviating external impacts.

The content of the above-described block copolymer is preferably not more than 50% by mass, more preferably 1 to 50% by mass, particularly preferably 5 to 35% by mass, based on the total solid contents of the thermosetting resin composition for forming the thermosetting resin composition layer.

An excellent laminate property and a residue removability of an opening part are exhibited by containing the block copolymer in this range.

In the above-described thermosetting resin composition, a thermosetting component except an epoxy resin and a thermosetting catalyst may be contained. The thermosetting component and the thermosetting catalyst may include the same as the above-described thermosetting component and thermosetting catalyst. The content of thermosetting catalyst is preferably 0.1 to 20 parts by mass, more preferably 0.5 to 15.0% by mass, with respect to 100 parts by mass of the above-described (A) epoxy resin.

(Organic Solvent)

To prepare a resin composition, or to control viscosity for applying on a substrate and a carrier film, an organic solvent may be used in the above-described photocurable resin composition and thermosetting resin composition.

Such organic solvents may include ketones, aromatic hydrocarbons, glycol ethers, glycol ether acetates, esters, alcohols, aliphatic hydrocarbons, petroleum-based solvents, and the like. More specific examples include ketones such as methyl ethyl ketone and cyclohexanone; aromatic hydrocarbons such as toluene, xylene, and tetramethylbenzene; glycol ethers such as cellosolve, methyl cellosolve, butyl cellosolve, carbitol, methyl carbitol, butyl carbitol, propylene glycol monomethyl ether, dipropylene glycol monomethyl ether, dipropylene glycol diethyl ether, and triethylene glycol monoethyl ether; esters such as ethyl acetate, butyl acetate, dipropylene glycol methyl ether acetate, propylene glycol methyl ether acetate, propylene glycol ethyl ether acetate, and propylene glycol butyl ether acetate; alcohols such as ethanol, propanol, ethylene glycol, and propylene glycol; aliphatic hydrocarbons such as octane and decane; petroleum-based solvents such as petroleum ether, petroleum naphtha, hydrogenated petroleum naphtha, and solvent naphtha; and the like. One of such organic solvents may be used alone or two or more thereof may be used as a mixture.

(Other Arbitrary Components)

The above-described photocurable resin composition and thermosetting resin composition may further contain, as required, components such as an elastomer, an adhesion-promoting agent, a coloring agent, an antioxidant and an ultraviolet absorber. As such components, those which are known in the field of electronic materials can be used. In addition, in the photocurable resin composition and thermosetting resin composition, known and commonly-used additives: a known and commonly-used thickening agent such as fine-powder silica, hydrotalcite, organic bentonite or montmorillonite; an antifoaming agent and/or a leveling agent such as a silicone-based, fluorine-based or polymeric antifoaming agent; a silicone coupling agent such as an imidazole-based, a thiazole-based or a triazole-based; or a corrosion inhibitor can also be contained.

The printed writing board according to the present invention is a printed writing board comprising a cured coating film which is obtained by using the above-described dry film according to the present invention onto a substrate on which a circuit pattern is formed, wherein the printed writing board includes the cured coating film which is obtained by curing a photocurable resin composition layer (L1) on the side of the surface layer, and at least the cured coating film which is obtained by curing the thermosetting resin composition layer (L2) in a gap between the substrate and the cured coating film obtained from the photocurable resin composition layer (L1).

In the printed writing board according to the present invention, the photocurable resin composition layer of the surface layer is photo-cured with an exposure apparatus for the irradiation with an active energy ray such as a high-pressure mercury lamp, an ultrahigh-pressure mercury lamp, a metal halide lamp or a mercury short arc lamp, and then the thermosetting resin composition layer is heated, for example, at a temperature of approximately 140 to 180° C., thereby post-curing the photocurable resin composition and thermal-curing the thermosetting resin composition to obtain a cured coating film. After preparing the cured coating film, the cured coating film is patterned by laser processing to form a fine pattern, and then removing a smear by desmear treatment. Laser processing and desmear treatment can be performed as a known method. Both wet and dry type method can be employed on desmear treatment.

<Method of Producing Printed Writing Board>

The method of producing the printed writing board according to the present invention comprises: a process in which a resin insulation layer which includes a thermosetting resin composition layer (L2) and a photocurable resin composition layer (L1) in order from a side of a substrate surface is formed on the substrate surface; a process to perform patterning by photolithographic approach; and a process to perform patterning by laser processing. By forming a dam using photolithographic approach, even an extensive dam can be formed with high-definition in the once developing process. In addition, it is possible to protect a conductive pattern after the developing process by the thermosetting resin composition layer (L2) located under the photocurable resin composition layer (L1). Laser processing may be employed on exposing a component mounting part such as a flip-chip interconnected conductor part, for example, a via forming part, so that high-definition patterning can be performed. Furthermore, it is possible to form the dam without affecting the pattern of the thermosetting resin composition layer (L2) for the purpose of coating of the conductor. In the method of producing the printed writing board according to the present invention, it is preferred that the photocurable resin composition layer (L1) is patterned using the process to perform patterning by photolithographic approach, and then the thermosetting resin composition layer (L2) is patterned using the process to perform patterning by laser processing. The dam formed with at least one of a groovy shape or a projecting shape is preferred. In addition, in the present invention, not only the dam, also a marking can be formed.

The method of producing the printed writing board according to the present invention will now be described in more details below.

(Process of Forming Resin Insulation Layer)

In the printed writing board according to the present invention, in the process in which a resin insulation layer which includes a thermosetting resin composition layer (L2) and a photocurable resin composition layer (L1) in order from a side of a substrate surface is formed on the substrate surface, the term "substrate surface" refers to a surface on which a component mounting part is placed. The photocurable resin composition layer (L1) and the thermosetting resin composition layer (L2) can be respectively formed using the photocurable resin composition and the thermosetting resin composition as described below. The film thickness of the respective layers of the photocurable resin composition layer (L1) and the thermosetting resin composition layer (L2) is not particularly restricted, and it is preferred that, after drying, the film thickness of the photocurable resin composition layer (L1) is 1 to 20 μm and the film thickness of the thermosetting resin composition layer (L2) is 1 to 100 μm. In addition, the resin insulation layer which forms a solder resist is preferred. A conductive pattern formed on the printed writing board is not particularly restricted, and conventionally known patterns including a copper foil may be used.

Such substrates as described above may include a printed wiring board or a flexible printed wiring board on which a circuit is preformed, as well as copper-clad laminates of all grades (FR-4 and the like) employing materials such as copper-clad laminates for high frequency circuit in which paper phenol, paper epoxy, glass fabric epoxy, glass polyimide, glass fabric/nonwoven fabric epoxy, glass fabric/paper epoxy, synthetic fiber epoxy, and fluorine/polyethylene/polyphenylene ether/polyphenylene oxide/cyanate ester are used; also polyimide films, PET films, glass substrates, ceramic substrates, wafer plates, and the like.

The thermosetting resin composition layer (L2) and the photocurable resin composition layer (L1) may include two or more resin composition layers. That is, other resin composition layers may be included in a gap between the substrate and the thermosetting resin composition layer (L2) and between the thermosetting resin composition layer (L2) and the photocurable resin composition layer (L1).

A method of forming the thermosetting resin composition layer (L2) and the photocurable resin composition layer (L1) on the substrate surface is not particularly restricted, and conventionally known methods can be employed. Examples of methods preferably include; a method to form a dry film, formed by laminating the photocurable resin composition layer (L1) and the thermosetting resin composition layer (L2) on a film, by laminating on the substrate; and a method to form by directly applying and drying the thermosetting resin composition and the photocurable resin composition on the substrate. The method of the former using the dry film is more preferably since the thermosetting resin composition layer (L2) and the photocurable resin composition layer (L1) can be simultaneously formed on the surface substrate. In the method using the above-described dry film, the dry film may comprise at least a carrier film, the photocurable resin composition layer (L1) formed by applying and drying the photocurable resin composition and the thermosetting resin composition layer (L2) formed by applying and drying the thermosetting resin composition. The resulting dry film may be laminated in order from the carrier film, the thermosetting resin composition layer (L2) and the photocurable resin composition layer (L1), or from the carrier film, the photocurable resin composition layer (L1) and the thermosetting resin composition layer (L2). In each embodiment, the dry film may be laminated on the substrate such that the photocurable resin composition layer (L1) is positioned as the surface layer and the thermosetting resin composition layer (L2) is positioned on the side of the substrate.

Alternatively, a method in which the thermosetting resin composition layer (L2) is formed by directly applying and drying the thermosetting resin composition on the substrate and then the dry film is laminated on the thus formed thermosetting resin composition layer (L2) to form the photocurable resin composition layer (L1) may also be employed.

Conversely, a method in which the dry film is laminated on the substrate to form the thermosetting resin composition layer (L2) and then the photocurable resin composition layer (L1) is formed by directly applying and drying the photocurable resin composition on the thus formed thermosetting resin composition layer (L2) may also be employed.

(Process to Perform Patterning by Photolithographic Approach)

As the process to perform patterning by photolithographic approach according to the present invention, patterning using conventionally known photolithographic approach by an exposing process and a developing process can be employed. A dam preventing from spreading an underfill can be simply and inexpensively form on the thermosetting resin composition layer (L2) by forming a recessed part in the photocurable resin composition layer (L1) with photolithographic approach.

An exposing process is not particularly restricted, for example, a process for selectively exposing to an active energy ray through a photomask in which a dam pattern is formed by a contact method (or a non-contact method) may be employed. Alternatively, a process for directly exposing to the pattern of the dam using a direct imaging device may be employed. However, when a wide range of the dam is formed, since the exposing time can be reduced, it is preferred to expose using the direct imaging device rather than to expose through the photomask.

As an exposing source of an exposure apparatus, for example, a metal halide lamp, a high-pressure mercury lamp, an ultrahigh-pressure mercury lamp, a mercury short arc lamp or LED can be employed. In case of exposing by using the direct imaging device, lasers such as a gas laser or a solid-state laser, ultraviolet lamps such as a high-pressure mercury lamp or an ultrahigh-pressure mercury lamp, or LED can be employed. As such the direct imaging apparatus, for example, those that are manufactured by Orbotech Japan Co., Ltd., ORC MANUFACTURING CO., LTD. and DAINIPPON SCREEN MFG. CO., LTD. can be employed.

As the active energy ray, it is preferred to use a laser light having the maximum wavelength in the range of 350 to 410 nm. By using a laser light having the maximum wavelength in this range, radicals can be efficiently generated from a photopolymerization initiator. Further, although the exposure does is variable depending on the film thickness and the like, it may be set in the range of generally 5 to 500 mJ/cm$^2$, preferably 10 to 300 mJ/cm$^2$.

An developing process is not particularly restricted, a dipping method, a shower method, a spray method or a brushing method may be employed. Further, as a developer, an aqueous alkali solution of potassium hydroxide, sodium hydroxide, sodium carbonate, potassium carbonate, sodium phosphate, sodium silicate, ammonia, amine or the like may be employed.

In the present invention, a pattern of a dam is not particularly restricted, it is preferred that the dam is formed to surround a component mounting part. Further, it may be forming a recessed part, for example, as showed in FIGS. 3 and 4, and then forming a groovy dam and/or a projecting dam. The width and depth (height) may be determined in response to an amount and/or a type of an underfill. In addition, a part except the dam may be also patterned using photolithographic approach.

When the photocurable resin composition layer (L1) includes a thermosetting component, the layer (L1) can be thermal-cured by a thermal treatment, for example, by heating at a temperature of approximately 140 to 180° C. It is noted here that, when the photocurable resin composition layer (L1) not include the thermosetting component, by the thermal treatment, an ethylenically unsaturated bond in a photocurable component which remain in an unreacted state during exposing is thermal-radical-polymerized, so that a property for coating a film can be improved. It is preferred that such thermal treatment is performed after exposing the thermosetting resin composition layer (L2) through the process for patterning by photolithographic approach, and before the process for patterning by laser processing. In this case, both the process to post-cure the photocurable resin composition and thermal-cure the thermosetting resin composition can be performed at the same time.

(Process to Perform Patterning by Laser Processing)

As the process to perform patterning by laser processing according to the present invention, patterning using conventionally known laser processing by irradiating a resin composition with the laser can be employed. By patterning with laser processing, a desired part can be formed in the thermosetting resin composition layer (L2), in addition, patterning a fine part such as forming a via on a component mounting part can be also performed. The thermosetting resin composition layer (L2) may be patterned by laser processing together with the photocurable resin composition layer (L1) in their entirety. Alternatively, the part exposed by the process for patterning by photolithographic approach may be patterned by laser processing. It is preferred that laser processing is performed after thermal-curing a thermosetting resin composition. As an irradiated laser, a carbon dioxide gas laser, an UV-YAG laser or an excimer laser or the like may be employed.

It is preferred that a resin residue (smear) and the like after laser irradiation is subjected to a removal treatment, that is desmear treatment, using an oxidant or the like including a permanganate and a dichromate. When desmear treatment is insufficient, there is a fear that an electrical conductivity is not sufficiently ensured due to the smear.

The specific examples of the method of producing the printed writing board and the flip-chip mounting substrate according to the present invention will now be described below based on FIGS. 2 to 4, but are not restricted to these specific examples.

Figure 2:
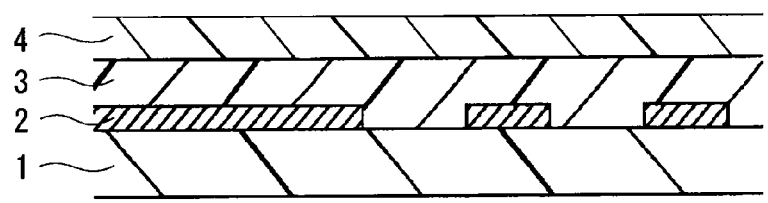
FIG. 2 is a schematic cross-sectional view to explain the process of the method of producing the printed writing board according to the present invention.

FIG. 2 shows that, on a surface of a substrate 1 formed a conductor pattern 2, a resin insulation layer 5 includes a thermosetting resin composition layer (L2) 3 and a photocurable resin composition layer (L1) 4 in order from the side of the substrate surface.

Figure 3:
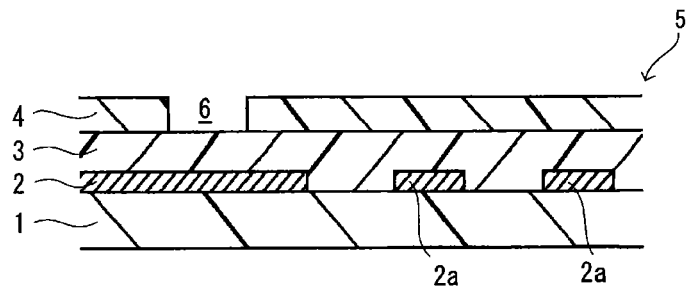
FIG. 3 is a schematic cross-sectional view to explain the process of the method of producing the printed writing board according to the present invention.
Figure 3:
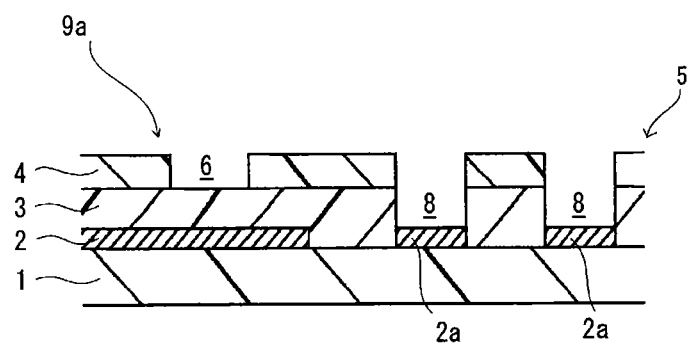
Figure 3:
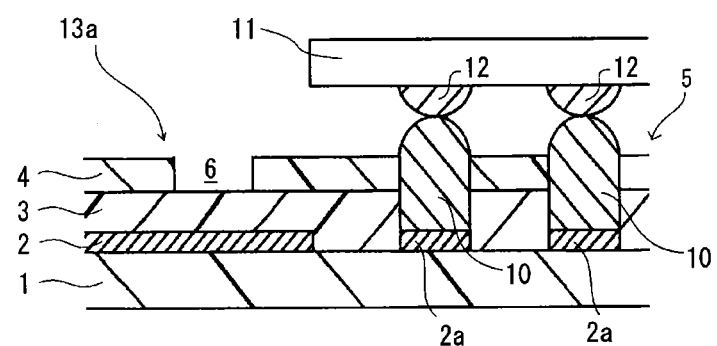
Figure 3:
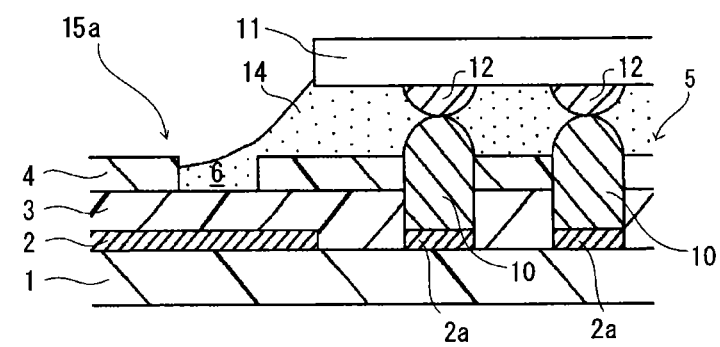
Figure 5:
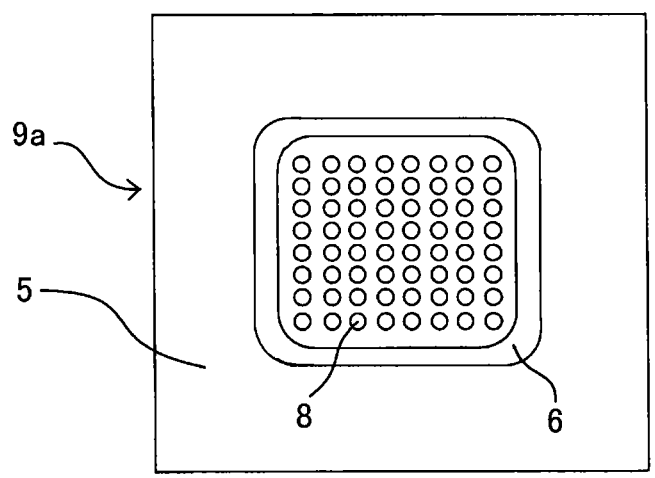
FIG. 5 is a schematic plan view showing the printed writing board on which the groovy dam is placed which is produced by the method of producing the printed writing board according to the present invention.

FIG. 3 shows the specific examples in cases where a groovy dam is formed by the method of producing the printed writing board according to the present invention. First, a groovy dam 6 is formed in the photocurable resin composition layer (L1) 4 to surround a component mounting part 2a by patterning using photolithographic approach (FIG. 3 (A)). In this process, since the thermosetting resin composition layer (L2) remains, there is no possibility that the conductor pattern is exposed. Therefore, the dam can be formed without affecting the pattern of the thermosetting resin composition layer (L2) for the purpose of coating the conductor. Then, a thermal treatment is performed, and both thermal treating the photocurable resin composition layer (L1) and thermal-curing the thermosetting resin composition layer (L2) are performed at the same time. In order to expose the component mounting part 2a, the thermosetting resin composition layer (L2) 3 is patterned by laser processing together with the photocurable resin composition layer (L1) 4 in their entirety, then an opening part 8 is placed (FIG. 3 (B)). In this process, both the coating film obtained from the photocurable resin composition layer (L1) and the coating film obtained from the thermosetting resin composition layer (L2) can be removed at the same time. In this manner, a printed writing board 9a in which the groovy dam is placed can be produced (FIG. 3 (B) and FIG. 5).

Figure 4:
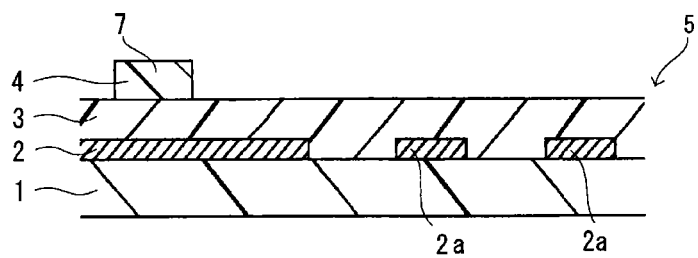
FIG. 4 is a schematic cross-sectional view to explain the process of the method of producing the printed writing board according to the present invention.
Figure 4:
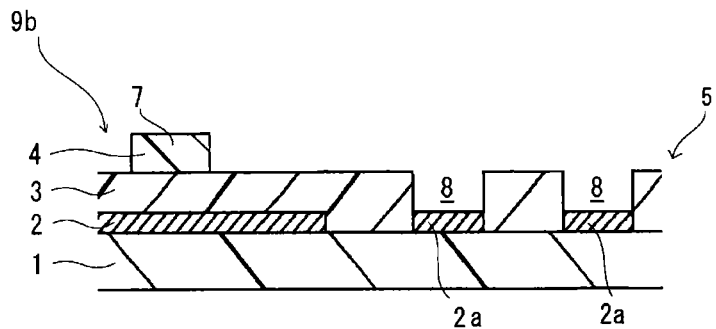
Figure 4:
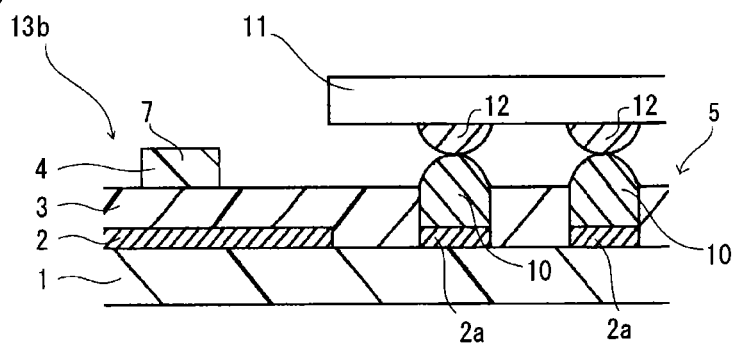
Figure 4:
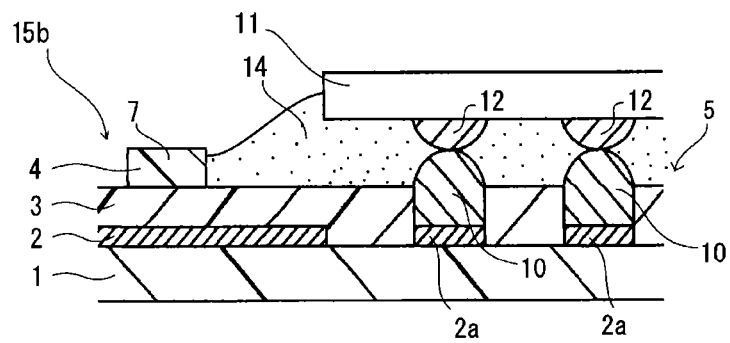

FIG. 4 shows the specific examples in cases where a projecting dam is formed by the method of producing the printed writing board according to the present invention. First, a projecting dam 7 is formed in the photocurable resin composition layer (L1) 4 to surround the component mounting part 2a by patterning using photolithographic approach (FIG. 4 (A)). In this process, since the thermosetting resin composition layer (L2) remains, there is no possibility that the conductor pattern is exposed in the same manner as described above. Therefore, the dam can be formed without affecting the pattern of the thermosetting resin composition layer (L2) for the purpose of coating the conductor. Then, a thermal treatment is performed, and both thermal treating the photocurable resin composition layer (L1) and thermal-curing the thermosetting resin composition layer (L2) are performed at the same time. In order to expose the component mounting part 2a, a printed writing board 9b in which the projecting dam is placed is produced by patterning the thermosetting resin composition layer (L2) 3 with laser processing and then placing the opening part 8 (FIG. 4 (B)).

As a method in which a chip is subjected to flip-chip interconnection to a printed writing board, a conventionally known method can be employed. For example, the method in which a solder ball 10 as a flip-chip interconnection terminal is placed in the opening part 8, the solder ball 10 is aligned to a bump 12 placed in a chip 11, and then the chip 11 is subjected to flip-chip interconnection by reflow (FIGS. 3 (C) and 4 (C)). When an underfill 14 filled to fill a gap between the chip and the printed writing board overflows, the overflowing underfill can be dammed by the groovy or projecting dam placed as described above (FIGS. 3 (D) and 4 (D)).

It is preferred that the photocurable resin composition constituting the photocurable resin composition layer (L1) includes a carboxyl group-containing resin, a photopolymerization initiator and a photosensitive monomer.

The carboxyl group-containing resin, the photopolymerization initiator and the photosensitive monomer are respectively the same as the above-described (E), (F) and (G). In addition, arbitrary components including a thermosetting component, a thermosetting catalyst and an inorganic filler are also the same as described above.

It is preferred that the thermosetting resin composition constituting the thermosetting resin composition layer (L2) includes an epoxy resin, an epoxy curing agent and an inorganic filler. In addition, it is preferred that the thermosetting resin composition further includes a thermoplastic resin.

The epoxy resin, the epoxy curing agent, the inorganic filler and the thermoplastic resin are respectively the same as the above-described (A), (B), (C) and (D). In addition, arbitrary components including a block copolymer and an organic solvent are also the same as described above.

The printed writing board for the flip-chip mounting substrate according to the prevent invention is produced by the method of the prevent invention. The specific examples which include, but are not restricted to, the printed writing board for the flip-chip mounting substrate produced by the above-described method which is explained with FIGS. 3 (A) and (B), and FIGS. 4 (A) and (B) are employed.

The flip-chip mounting substrate according to the prevent invention is subjected to flip chip mounting on the printed writing board for the flip-chip mounting substrate according to the prevent invention. The specific examples which include, but are not restricted to, the printed writing board for the flip-chip mounting substrate on which the flip-chip is mounted as the above-described method which is explained with FIG. 3 (C) and FIG. 4 (C) are employed. In addition, the gap between the chip and the printed writing board can be filled with the underfill (for example, FIG. 3 (D) and FIG. 4 (D))

EXAMPLES

The present invention will now be described concretely by way of examples and comparative examples thereof;

however, the present invention is not restricted to the following examples by any means. It is noted here that, in the following Examples and Comparative Examples, "part(s)" and "%" are by mass unless otherwise specified.

(Preparation of Varnishes for the Layer (L1) and the Layer (L2))

The components shown in the following Table 1 were blended at the ratios (parts by mass) shown in the table, the resultants were each pre-mixed using a stirrer and then kneaded with a 3-roll mill to prepare photocurable resin composition varnishes for the layer (L1). In the same manner, the components shown in the following Table 2 were blended at the ratios (parts by mass) shown in the table, the resultants were each pre-mixed using a stirrer and then kneaded with a 3-roll mill to prepare thermosetting resin composition varnishes for the layer (L2).

[FIG. 1]

|  | L1-1 | L1-2 | L1-3 | L1-4 | L1-5 | L1-6 |
|---|---|---|---|---|---|---|
| Epoxy acrylate resin *1 | 153 | — | — | 76.9 | 153 | 153 |
| Copolymerized acrylate resin *2 | — | 222 | — | — | — | — |
| Acrylate resin *3 | — | — | 153 | 76.9 | — | — |
| Acrylate monomer *4 | 20 | 20 | 20 | 20 | 20 | 20 |
| Photopolymerization initiator *5 | 2 | 1 | — | — | — | — |
| Photopolymerization initiator *6 | — | — | 8 | — | — | — |
| Photopolymerization initiator *7 | — | 8 | — | 8 | 8 | 8 |
| Tetramethylbiphenyl epoxy *8 | — | — | — | 40 | — | — |
| Imidazole *9 | — | — | — | 1 | — | — |
| Spherical silica *10 | — | — | — | — | 15 | 55 |
| Total amount (varnish) | 175 | 251 | 181 | 222.8 | 196 | 236 |
| Total amount (solid content) | 121 | 129 | 127 | 169 | 143 | 183 |
| Combination ratio of filler (% by mass) | 0 | 0 | 0 | 0 | 10 | 30 |

*1: R-2000PG (manufactured by DIC Corporation); solid content = 65%
*2: CYCLOMER-P (ACA) Z250 (manufactured by DAICEL-ALLNEX LTD.); solid content = 45%
*3: RMA-11902 (manufactured by NIPPON NYUKAZAI CO., LTD.); solid content = 65%
*4: DA-600 (manufactured by Sanyo Chemical Industries, Ltd.)
*5: IRGACURE OXE02 (manufactured by BASF Japan Ltd.)
*6: IRGACURE 389 (manufactured by BASF Japan Ltd.)
*7: LUCIRIN TPO (manufactured by BASF Japan Ltd.)
*8: YX-4000 (manufactured by Mitsubishi Chemical Corporation); powder
*9: 1B2PZ (manufactured by SHIKOKU CHEMICALS CORPORATION)
*10: SO-C2 (manufactured by Admatechs Company Limited.); D50 = 0.5 μm

[FIG. 2]

|  | L2-1 | L2-2 | L2-3 | L2-4 | L2-5 | L2-6 | L2-7 | L2-8 | L2-9 |
|---|---|---|---|---|---|---|---|---|---|
| Epoxy resin *1 | 50 | — | — | 15 | 15 | 15 | 15 | 15 | 15 |
| Epoxy resin *2 | 50 | 100 | — | 40 | 40 | 40 | 40 | 40 | 40 |
| Epoxy resin *3 | — | — | 167 | 75 | 75 | 75 | 75 | 75 | 75 |
| Phenol resin *4 | 47 | 47 | 47 | 47 | 47 | 47 | — | — | — |
| Carboxylic acid-terminaed multi-branched imide resin *5 | — | — | — | — | — | — | — | 111 | — |
| Activated ester resin *6 | — | — | — | — | — | — | 62 | — | — |
| Cyanate ester resin *7 | — | — | — | — | — | — | — | — | 50 |
| Phenoxy resin *8 | — | 133 | 133 | — | — | — | 150 | 167 | 167 |
| MMA/nBA block copolymer *9 | — | — | — | 133 | — | — | — | — | — |
| MMA/nBA block copolymer *10 | — | — | — | — | 133 | — | — | — | — |
| Cellulose acetate propionate *11 | — | — | — | — | — | 20 | — | — | — |
| Polyvinyl acetal *12 | — | — | — | — | — | 66.7 | — | — | — |
| Spherical silica *13 | 250 | — | — | 250 | 250 | 250 | 280 | 300 | 310 |
| Spherical alumina *14 | — | 250 | — | — | — | — | — | — | — |
| Boron nitride *15 | — | — | 250 | — | — | — | — | — | — |
| Cobalt acetylacetonate *16 | — | — | — | — | — | — | — | — | 5 |
| Imidazole *17 | 1 | 1 | 1 | 1 | 1 | 1 | 1 | 1 | — |
| Total amount (varnish) | 398 | 531 | 598 | 561 | 561 | 514.7 | 623 | 709 | 662 |
| Total amount (solid content) | 379 | 419 | 419 | 419 | 419 | 419 | 466 | 501 | 515 |
| Content of polymer resin (solid content) *18 | 0 | 40 | 40 | 40 | 40 | 40 | 45 | 50 | 50 |
| Combination ratio of polymer resin (% by mass) *19 | 0 | 10 | 10 | 10 | 10 | 10 | 10 | 10 | 10 |
| Combination ratio of filler (% by mass) | 66 | 60 | 60 | 60 | 60 | 60 | 60 | 60 | 60 |

*1: bisphenol A-type liquid epoxy resin, 828 (manufactured by Mitsubishi Chemical Corporation)
*2: naphthol type epoxy resin, HP-4032 (manufactured by DIC Corporation)
*3: cresol-novolak type epoxy resin, N-665 H60 (manufactured by DIC Corporation); dissolved by cyclohexane, solid content = 60%
*4: phenol-novolak type, HF-1M H60 (manufactured by Meiwa Plastic Industries, Ltd); dissolved by cyclohexane, solid content = 60%
*5: V-8000 (manufactured by DIC Corporation); solid content = 45%
*6: EXB9596-65T (manufactured by DIC Corporation); solid content = 65%
*7: PT30 (manufactured by Lonza Group Ltd.); semi-solid
*8: FX293H30 (manufactured by NIPPON STEEL & SUMIKIN CHEMICAL CO., LTD.); Mw = 30,000 to 50,000, dissolved by cyclohexane, solid content = 30%
*9: MMA parts hydrophilicity treatment, MAM M52N H30 (manufactured by ARKEMA GROUP); dissolved by cyclohexane, solid content = 30%
*10: MAM M52 H30 (manufactured by ARKEMA GROUP); Mw = 95,000, dissolved by cyclohexane, solid content = 30%
*11: CAP-482-20 (manufactured by Eastman Chemical Company); Mw = 75,000
*12: S-LEC KS10 H30 (manufactured by SEKISUI CHEMICAL CO., LTD.); Mw = 17,000, dissolved by cyclohexane, solid content = 30%

-continued

[FIG. 2]

| | L2-1 | L2-2 | L2-3 | L2-4 | L2-5 | L2-6 | L2-7 | L2-8 | L2-9 |
|---|---|---|---|---|---|---|---|---|---|

*13: SO-C2 (manufactured by Admatechs Company Limited.); D50 = 0.5 μm
*14: AO-802 (manufactured by Admatechs Company Limited.); D50 = 0.7 μm
*15: SN-9FWS (manufactured by DENKI KAGAKU KOGYO KABUSHIKI KAISHA); D50 = 0.7 μm
*16: Co (II) acetylacetonate, 1% DMF solution
*17: 1B2PZ (manufactured by SHIKOKU CHEMICALS CORPORATION)
*18: The content of the solid content conversion in a thermoplastic resin or a block copolymer.
*19: The combination ratio of the solid content conversion in a thermoplastic resin or a block copolymer.

The varnish for the layer (L1) prepared as described in the above was applied onto a carrier film (PET film, thickness=38 μm) using an applicator. Here, after drying the resultant at 90° C. for 10 minutes, the application amount was adjusted such that the thickness of the resultant was approximately 5 μm. After drying at 90° C. for 10 minutes, the varnish for the layer (L2) prepared as described in the above was applied onto the layer (L1) using the applicator. The application amount of the varnish for the layer (L2) was adjusted such that the thickness of the resultant after drying at 90° C. for 10 minutes was approximately 20 μm.

(Preparation of Test Substrate)

The test substrates of the respective Examples and Comparative Examples were prepared by using the varnishes for the layer (L1) and the layer (L2) as described in the following Table 3 and 4. A single-sided printed writing board having a 15 μm-thick copper circuit pattern formed thereon in advance was prepared and subjected to a pre-treatment using CZ-8100 (manufactured by MEC COMPANY LTD.). After that, the substrate on which the layer (L2) and the layer (L1) were laminated in order from the substrate was prepared by laminating the dry films prepared as described in the above with a vacuum laminator. This lamination was performed under the conditions in which the thickness of the film after lamination became approximately 15 μm on the copper.

Next, after photo-curing the photocurable resin composition of the layer (L1) by using an exposure apparatus equipped with a high-pressure mercury lamp at an optimum exposure dose, the carrier film was detached and the resultant was thermal-cured in a hot air circulation-type drying oven at 170° C. for 60 minutes, thereby preparation the test substrate.

(Evaluation of Test Substrate)

According to the following method, the test substrates of the respective Examples and Comparative Examples were evaluated. The results are showed in the following Table 3 and 4.

(Laser Processability)

The laser processability was evaluated by using a $CO_2$ laser (manufactured by Hitachi Via Mechanics, Ltd.) The target processing diameters were: top diameter=65 μm and bottom diameter=50 μm. The processing conditions were: aperture (mask diameter)=3.1 mm, pulse width=20 μsec, output=2W, frequency=5 kHz, and number of shots=3 burst shots. The respective test substrates were evaluated in accordance with the following criteria. It is noted here that the difference from the target processing diameter means both cases which the resultant diameter is longer or smaller than the target processing diameter.

○: the difference from the target processing diameter was less than ±2 μm

Δ: the difference from the target processing diameter was 2 to 5 μm.

×: the difference from the target processing diameter was greater than ±5 μm (Surface Condition after Desmear)

According to the following desmear conditions and evaluation criteria, a desmear resistance was evaluated by using an aqueous permanganate desmear solution (a wet method).

Drug solutions used in desmear treatment (manufactured by The Dow Chemical Company) and the conditions were as follows.

Swelling: MLB-211, temperature=80° C., time=10 minutes

Permanganate: MLB-213, temperature=80° C., time=15 minutes

Reduction: MLB-216, temperature=50° C., time=5 minutes

To evaluate the surface condition after desmear, the surface roughness, Ra, was measured under a laser microscope (VK-8500, manufactured by Keyence Corporation). The evaluation criteria were as follows.

○: The surface roughness, Ra, was less than 0.1 μm.

Δ: The surface roughness, Ra, was 0.1 to 0.3 μm.

×: The surface roughness, Ra, was greater than 0.3 μm.

(Surface Condition Around Via Hole Part)

A SEM observation around a via hole part after desmear treatment was performed and the surface condition was evaluated according to the following criteria.

○: The damage around a via hole part after desmear treatment was not observed.

Δ: The damage around a via hole part after desmear treatment was slightly observed.

×: The damage around a via hole part after desmear treatment was observed.

Here, SEM pictures after laser processing and desmear treatment about the test substrates of Example 1, Comparative Example 1 and Comparative Example 2 are showed in FIG. 1. White line in the picture bottom represents 10 μm.

TABLE 3

| | Example 1 | Example 2 | Example 3 | Example 4 | Example 5 | Example 6 | Example 7 | Example 8 |
|---|---|---|---|---|---|---|---|---|
| Layer (L1) | L1-1 | L1-2 | L1-3 | L1-4 | L1-5 | L1-6 | L1-1 | L1-1 |
| Layer (L2) | L2-1 | L2-1 | L2-1 | L2-1 | L2-1 | L2-1 | L2-2 | L2-3 |
| Laser processability | ○ | ○ | ○ | ○ | ○ | Δ | ○ | ○ |
| Surface condition after desmear | ○ | ○ | ○ | ○ | Δ | Δ | ○ | ○ |

TABLE 3-continued

|  | Example 1 | Example 2 | Example 3 | Example 4 | Example 5 | Example 6 | Example 7 | Example 8 |
|---|---|---|---|---|---|---|---|---|
| Surface condition around via hole part | ○ | ○ | ○ | ○ | ○ | Δ | ○ | ○ |

TABLE 4

|  | Example 9 | Example 10 | Example 11 | Example 12 | Example 13 | Example 14 | Comparative Example 1 | Comparative Example 2 | Comparative Example 3 |
|---|---|---|---|---|---|---|---|---|---|
| Layer (L1) | L1-1 | L1-1 | L1-1 | L1-1 | L1-1 | L1-1 | — | — | — |
| Layer (L2) | L2-4 | L2-5 | L2-6 | L2-7 | L2-8 | L2-9 | L2-1 | L2-7 | L2-8 |
| Laser processability | ○ | ○ | ○ | ○ | ○ | ○ | x | x | x |
| Surface condition after desmear | ○ | ○ | ○ | ○ | ○ | ○ | x | x | Δ |
| Surface condition around via hole part | ○ | ○ | ○ | ○ | ○ | ○ | x | x | x |

As evidenced by the results of the respective Examples, it was confirmed that the resistance for desmear treatment was significantly improved by comprising the layer formed by the cured product of the photocurable resin composition on the surface layer. In addition, the test substrates of the respective Examples had also excellent laser processability. In contrast, the test substrates of Comparative Examples comprising a resist layer which was only formed by the cured product of the thermosetting resin composition without forming by the cured product of the photocurable resin composition on the surface layer had deteriorated both the laser processability and desmear resistance.

(Preparation of Test Substrate)

The test substrates of the respective Examples were prepared by using varnishes for the photocurable resin composition layer and the thermosetting resin composition layer as described in the following Table 5 and 6. A single-sided printed writing board having a 15 μm-thick copper circuit pattern formed thereon in advance was prepared and subjected to a pre-treatment using CZ-8100 (manufactured by MEC COMPANY LTD.). After that, the substrate on which the thermosetting resin composition layer and the photocurable resin composition layer were laminated in order from the substrate was prepared as the test substrates by laminating the dry films prepared as described in the above with a vacuum laminator. This lamination was performed under the condition in which the thickness of the film after lamination became approximately 15 μm on the copper.

(Evaluation of Test Substrate)

According to the following method, the test substrates of the respective Examples were evaluated. The results are showed in the following Table 5 and 6.

(Forming Groovy or Projecting Dam by Photolithographic Approach)

After exposing the above-described test substrate using an exposure apparatus equipped with a high-pressure mercury lamp such that a groovy or projecting dam with: line width=100 μm and vertical=11 μm x horizontal=11 μm was formed on the test substrate, the carrier film was detached and the resultant was developed for 90 seconds with 1.0%-by-mass $Na_2CO_3$ aqueous solution at 30° C. In this process, the sensitivity of the step tablet (No. 2, twentyone tiers, manufactured by Kodak Japan Ltd.) remained in seven tiers was defined as the exposure does. Then, the resultant was thermal-cured in a hot air circulation-type drying oven at 170° C. for 60 minutes. The substrate after drying was observed and then forming or not forming the groovy or projecting dam thereon was evaluated. It was evaluated as "○" in cases where the groovy or projecting dam can be formed.

(Laser Processability)

The laser processability was evaluated by using a $CO_2$ laser (manufactured by Hitachi Via Mechanics, Ltd.) The target processing diameters were: top diameter=65 μm and bottom diameter=50 μm. The processing conditions were: aperture (mask diameter)=3.1 mm, pulse width=20 μsec, output=2W, frequency=5 kHz, and number of shots=3 burst shots. The thermosetting resin composition layer was laser-processed together with the photocurable resin composition layer in their entirety, and then the respective test substrates were evaluated in accordance with the following criteria. It is noted here that the difference from the target processing diameter means both cases which the resultant diameter is longer or smaller than the target processing diameter.

○: the difference from the target processing diameter was less than ±2 μm

Δ: the difference from the target processing diameter was 2 to 5 μm.

TABLE 5

|  | Example 15 | Example 16 | Example 17 | Example 18 | Example 19 | Example 20 | Example 21 | Example 22 |
|---|---|---|---|---|---|---|---|---|
| Layer (L1) | L1-1 | L1-2 | L1-3 | L1-4 | L1-5 | L1-6 | L1-1 | L1-1 |
| Layer (L2) | L2-1 | L2-1 | L2-1 | L2-1 | L2-1 | L2-1 | L2-2 | L2-3 |
| Forming groovy dam | ○ | ○ | ○ | ○ | ○ | ○ | ○ | ○ |

TABLE 5-continued

|  | Example 15 | Example 16 | Example 17 | Example 18 | Example 19 | Example 20 | Example 21 | Example 22 |
|---|---|---|---|---|---|---|---|---|
| Forming projecting dam | ○ | ○ | ○ | ○ | ○ | ○ | ○ | ○ |
| Laser processability | ○ | ○ | ○ | ○ | ○ | Δ | ○ | ○ |

TABLE 6

|  | Example 23 | Example 24 | Example 25 | Example 26 | Example 27 | Example 28 |
|---|---|---|---|---|---|---|
| Layer (L1) | L1-1 | L1-1 | L1-1 | L1-1 | L1-1 | L1-1 |
| Layer (L2) | L2-4 | L2-5 | L2-6 | L2-7 | L2-8 | L2-9 |
| Forming groovy dam | ○ | ○ | ○ | ○ | ○ | ○ |
| Forming projecting dam | ○ | ○ | ○ | ○ | ○ | ○ |
| Laser processability | ○ | ○ | ○ | ○ | ○ | ○ |

As evidenced by the results of the respective Examples, the dam could be formed by patterning the resin insulation layer which included the thermosetting resin composition layer and the photocurable resin composition layer in order from the side of the substrate surface with photolithographic approach. In such method of forming the dam, the high-definition dam may be formed as compared with another method including screen printing, and the dam may be also formed rapidly as compared with laser processing.

The test substrates of the respective Examples had also excellent laser processability.

DESCRIPTION OF SYMBOLS

1: Substrate
2: Conductor pattern
2a: Component mounting part
3: Thermosetting resin composition layer
4: Photocurable resin composition layer
5: Resin insulation layer
6: Groovy dam
7: Projecting dam
8: Opening part
9a: Printed writing board
9b: Printed writing board
10: Solder ball
11: Chip
12: Bump
13a: Flip-chip mounting substrate
13b: Flip-chip mounting substrate
14: Underfill
15a: Flip-chip mounting substrate filled with underfill
15b: Flip-chip mounting substrate filled with underfill

The invention claimed is:
1. A dry film, comprising:
a carrier film;
a thermosetting resin composition layer; and
a photocurable resin composition layer formed between the thermosetting resin composition layer and the carrier film,
wherein the thermosetting resin composition layer comprises an epoxy resin, an epoxy curing agent, and an inorganic filler,
the photocurable resin composition layer comprises a carboxyl group-containing resin, a photopolymerization initiator, and a compound having at least one ethylenically unsaturated group in a molecule, and
the carboxyl group-containing resin in the photocurable resin composition layer is at least one carboxyl group-containing resin selected from the group consisting of
(1) a carboxyl group-containing resin obtained by copolymerization of an unsaturated carboxylic acid and an unsaturated group-containing compound,
(2) a carboxyl group-containing urethane resin obtained by a polyaddition reaction of a diisocyanate, a carboxyl group-containing dialcohol compound, and a diol compound,
(3) a carboxyl group-containing photosensitive urethane resin obtained by a polyaddition reaction of a diisocyanate, a (meth)acrylate or partial acid anhydride-modified product of a bifunctional epoxy resin, a carboxyl group-containing dialcohol compound, and a diol compound,
(4) a carboxyl group-containing photosensitive urethane resin having a (meth)acrylated terminal, which is obtained by adding a compound having one hydroxyl group and at least one (meth)acryloyl group in the molecule during a synthesis of the resin of (2) or (3),
(5) a carboxyl group-containing photosensitive urethane resin having a (meth)acrylated terminal, which is obtained by adding a compound having one isocyanate group and at least one (meth)acryloyl group in the molecule during a synthesis of the resin of (2) or (3),
(6) a carboxyl group-containing photosensitive resin prepared by reacting a polyfunctional solid epoxy resin having two or more functional groups with (meth)acrylic acid, and then adding a dibasic acid anhydride to a hydroxyl group existing in a side chain of the resultant,
(7) a carboxyl group-containing photosensitive resin prepared by reacting (meth)acrylic acid with a polyfunctional epoxy resin, which is obtained by epoxidizing a hydroxyl group of a bifunctional solid epoxy resin with epichlorohydrin, and then adding a dibasic acid anhydride to the resulting hydroxyl group,
(8) a carboxyl group-containing polyester resin prepared by reacting a bifunctional oxetane resin with a dicar- boxylic acid, and then adding a dibasic acid anhydride to the resulting primary hydroxyl group, (9) a carboxyl group-containing photosensitive resin prepared by reacting an unsaturated group-containing monocarboxylic acid with a reaction product obtained by a reaction between a compound having a plurality of phenolic hydroxyl groups in one molecule and an alkylene oxide, and then reacting the obtained product with a polybasic acid anhydride,

(10) a carboxyl group-containing photosensitive resin prepared by reacting an unsaturated group-containing monocarboxylic acid with a reaction product obtained by a reaction between a compound having a plurality of phenolic hydroxyl groups in one molecule and a cyclic carbonate compound, and then reacting the obtained product with a polybasic acid anhydride, and

(11) a carboxyl group-containing photosensitive resin obtained by adding a compound having one epoxy group and at least one (meth)acryloy group in one molecule to an one of the resins of (1) to (10).

2. The dry film according to claim 1, wherein the photocurable resin composition layer has a film thickness of from 1 to 20 μm, and the thermosetting resin composition layer has a film thickness of from 1 to 100 μm.

3. The dry film according to claim 1, wherein an inorganic filler is included in the photocurable resin composition layer in an amount of from 0 to 40% by weight based on a total amount of solid contents of a photocurable resin composition forming the photocurable resin composition layer.

4. The dry film according to claim 1, wherein the thermosetting resin composition layer further comprises a thermoplastic resin.

5. The dry film according to claim 4, wherein the thermoplastic resin has a weight-average molecular weight of 5,000 or larger.

6. A printed writing board, comprising:
a substrate having a circuit pattern formed thereon; and
a cured coating film formed on the substrate and made from the dry film according to claim 1,
wherein the cured coating film includes a first cured film obtained by curing the photocurable resin composition layer, and a second cured film obtained by curing the thermosetting resin composition layer and positioned between the substrate and the first cured film.

7. A method of producing a printed writing board, comprising:
forming on a substrate a resin insulation layer including a thermosetting resin composition layer and a photocurable resin composition layer such that the thermosetting resin composition layer is formed on the substrate and the photocurable resin composition layer is formed on the thermosetting resin composition layer;
patterning the resin insulation layer by photolithography; and
patterning the resin insulation layer by laser processing,
wherein the thermosetting resin composition layer comprises an epoxy resin, an epoxy curing agent, and an inorganic filler,
the photocurable resin composition layer comprises a carboxyl group-containing resin, a photopolymerization initiator, and a compound having at least one ethylenically unsaturated group in a molecule, and
the carboxyl group-containing resin in the photocurable resin composition layer is at least one carboxyl group-containing resin selected from the group consisting of (1) a carboxyl group-containing resin obtained by copolymerization of an unsaturated carboxylic acid and an unsaturated group-containing compound, (2) a carboxyl group-containing urethane resin obtained by a polyaddition reaction of a diisocyanate, a carboxyl group-containing dialcohol compound, and a diol compound, (3) a carboxyl group-containing photosensitive urethane resin obtained by a polvaddition reaction of a diisocyanate, a (meth)acrylate or partial acid anhydride-modified product of a bifunctional epoxy resin, a carboxyl group-containing dialcohol compound, and a diol compound, (4) a carboxyl group-containing photosensitive urethane resin having a (meth)acrylated terminal, which is obtained by adding a compound having one hydroxyl group and at least one (meth)acryloyl group in the molecule during a synthesis of the resin of (2) or (3), (5) a carboxyl group-containing photosensitive urethane resin having a (meth)acrylated terminal, which is obtained by adding a compound having one isocyanate group and at least one (meth)acryloyl group in the molecule during a synthesis of the resin of (2) or (3), (6) a carboxyl group-containing photosensitive resin prepared by reacting a polyfunctional solid epoxy resin having two or more functional groups with (meth)acrylic acid, and then adding a dibasic acid anhydride to a hydroxyl group existing in a side chain of the resultant, (7) a carboxyl group-containing photosensitive resin prepared by reacting (meth)acrylic acid with a polyfunctional epoxy resin, which is obtained by epoxidizing a hydroxyl group of a bifunctional solid epoxy resin with epichlorohydrin, and then adding a dibasic acid anhydride to the resulting hydroxyl group, (8) a carboxyl group-containing polyester resin prepared by reacting a bifunctional oxetane resin with a dicarboxylic acid, and then adding a dibasic acid anhydride to the resulting primary hydroxyl group, (9) a carboxyl group-containing photosensitive resin prepared by reacting an unsaturated group-containing monocarboxylic acid with a reaction product obtained by a reaction between a compound having a plurality of phenolic hydroxyl groups in one molecule and an alkylene oxide, and then reacting the obtained product with a polybasic acid anhydride,

(10) a carboxyl group-containing photosensitive resin prepared by reacting an unsaturated group-containing monocarboxylic acid with a reaction product obtained by a reaction between a compound having a plurality of phenolic hydroxyl groups in one molecule and a cyclic carbonate compound, and then reacting the obtained product with a polybasic acid anhydride, and

(11) a carboxyl group-containing photosensitive resin obtained by adding a compound having one epoxy group and at least one (meth)acryloyl group in one molecule to any one of the resins of (1) to (10).

8. The method according to claim 7, wherein the patterning of the resin insulation layer by photolithography comprises forming a dam having a recessed portion.

9. The method according to claim 8, wherein the dam has at least one of a groove and a projection.

10. The method according to claim 7, wherein the forming of the resin insulation layer comprises placing on the substrate a dry film including the photocurable resin composition layer, the thermosetting resin composition layer, and a film.

11. The method according to claim 7, wherein said the forming of the resin insulation layer comprises directly applying and drying a thermosetting resin composition on the substrate to form the thermosetting resin composition layer, and thereafter directly applying and drying a photocurable resin composition on the thermosetting resin composition layer.

12. The method according to claim 7, wherein the patterning of the resin insulation layer by photolithography comprises patterning the photocurable resin composition layer, and the patterning of the resin insulation layer by laser processing comprises patterning the thermosetting resin composition layer.

13. A printed writing board, produced by the method according to claim 7.

14. A flip-chip mounting substrate, comprising:
the printed wiring board according to claim 13; and
a chip which is flip-chip mounted on the printed wiring board.

15. The dry film according to claim 2, wherein an inorganic filler is included in the photocurable resin composition layer in an amount of from 0 to 40% by weight based on a total amount of solid contents of a photocurable resin composition forming the photocurable resin composition layer.

16. The dry film according to claim 1, wherein the carboxyl group-containing resin in the photocurable resin composition layer is at least one of
(9) a carboxyl group-containing photosensitive resin prepared by reacting an unsaturated group-containing monocarboxylic acid with a reaction product obtained by a reaction between a compound having a plurality of phenolic hydroxyl groups in one molecule and an alkylene oxide, and then reacting the obtained product with a polybasic acid anhydride, and
(10) a carboxyl group-containing photosensitive resin prepared by reacting an unsaturated group-containing monocarboxylic acid with a reaction product obtained by a reaction between a compound having a plurality of phenolic hydroxyl groups in one molecule and a cyclic carbonate compound, and then reacting the obtained product with a polybasic acid anhydride.

17. The dry film according to claim 1, wherein the carboxyl group-containing resin has an acid value in the range of from 40 to 200 mg KOH/g.

18. The dry film according to claim 1, wherein the carboxyl group-containing resin has a weight-average molecular weight in a range of from 2,000 to 150,000.

19. The dry film according to claim 1, wherein the photopolymerization initiator is at least one photopolymerization initiator selected from the group consisting of an oxime ester-based photopolymerization initiator having an oxime ester group, an α-aminoacetophenone-based photopolymerization initiator, and an acylphosphine oxide-based photopolymerization initiator.

20. The method according to claim 7, wherein the carboxyl group-containing resin in the photocurable resin composition layer is at least one of
(9) a carboxyl group-containing photosensitive resin prepared by reacting an unsaturated group-containing monocarboxylic acid with a reaction product obtained by a reaction between a compound having a plurality of phenolic hydroxyl groups in one molecule and an alkylene oxide, and then reacting the obtained product with a polybasic acid anhydride, and
(10) a carboxyl group-containing photosensitive resin prepared by reacting an unsaturated group-containing monocarboxylic acid with a reaction product obtained by a reaction between a compound having a plurality of phenolic hydroxyl groups in one molecule and a cyclic carbonate compound, and then reacting the obtained product with a polybasic acid anhydride.

* * * * *